(12) United States Patent
Kusano

(10) Patent No.: US 8,963,402 B2
(45) Date of Patent: Feb. 24, 2015

(54) PIEZOELECTRIC VIBRATOR ELEMENT, PIEZOELECTRIC MODULE, AND ELECTRONIC DEVICE

(75) Inventor: Jun Kusano, Suwa (JP)

(73) Assignee: Seiko Epson Corporation (JP)

( * ) Notice: Subject to any disclaimer, the term of this patent is extended or adjusted under 35 U.S.C. 154(b) by 305 days.

(21) Appl. No.: 13/295,547

(22) Filed: Nov. 14, 2011

(65) Prior Publication Data

US 2012/0133248 A1    May 31, 2012

(30) Foreign Application Priority Data

Nov. 30, 2010  (JP) ................. 2010-266715
Aug. 18, 2011  (JP) ................. 2011-178998

(51) Int. Cl.
  *H01L 41/053*  (2006.01)
  *H03H 9/05*   (2006.01)
  *H03H 9/02*   (2006.01)
  *H03H 9/10*   (2006.01)
  *H03H 9/19*   (2006.01)

(52) U.S. Cl.
  CPC ......... *H03H 9/0519* (2013.01); *H03H 9/02023* (2013.01); *H03H 9/0509* (2013.01); *H03H 9/0547* (2013.01); *H03H 9/0552* (2013.01); *H03H 9/1021* (2013.01); *H03H 9/19* (2013.01); *H03H 9/02133* (2013.01)
  USPC ............................ 310/348; 310/353; 310/367

(58) Field of Classification Search
  CPC ..... H03H 9/1021; H03H 3/02; H03H 9/0207; H01L 41/053
  USPC ................................. 310/348, 320
  See application file for complete search history.

(56) References Cited

U.S. PATENT DOCUMENTS

| | | | | |
|---|---|---|---|---|
| 7,388,320 B2 * | 6/2008 | Oda et al. | ....... | 310/348 |
| 7,608,987 B2 * | 10/2009 | Naito et al. | ....... | 310/361 |
| 7,732,995 B2 * | 6/2010 | Tsuchido et al. | ....... | 310/348 |
| 2004/0036380 A1 | 2/2004 | Oda et al. | | |
| 2004/0174092 A1 | 9/2004 | Iwata | | |
| 2006/0214749 A1 * | 9/2006 | Yamada | ....... | 333/200 |

(Continued)

FOREIGN PATENT DOCUMENTS

| | | |
|---|---|---|
| EP | 1724919 A2 | 11/2006 |
| JP | 56-094813 | 7/1981 |

(Continued)

OTHER PUBLICATIONS

Extended European Search Report for Application No. EP 11 19 0914 dated Apr. 23, 2013 (6 pages).

*Primary Examiner* — Thomas Dougherty
*Assistant Examiner* — Bryan Gordon
(74) *Attorney, Agent, or Firm* — Harness, Dickey & Pierce, P.L.C.

(57) ABSTRACT

A piezoelectric vibrator element includes a vibrating portion that excites thickness-shear vibration, and a peripheral portion that is disposed on the periphery of the vibrating portion and has a thickness thinner than the vibrating portion, the vibrating portion and the peripheral portion being formed in a piezoelectric substrate. A buffering portion and a mount portion are sequentially connected to the peripheral portion. The buffering portion includes a slit formed between the mount portion and the peripheral portion. The mount portion has notches which are formed at both end portions in a direction orthogonal to an arrangement direction of the mount portion, the buffering portion, and the peripheral portion.

13 Claims, 25 Drawing Sheets

(56) References Cited

U.S. PATENT DOCUMENTS

| | | | |
|---|---|---|---|
| 2006/0244346 A1 | 11/2006 | Iwata | |
| 2007/0024163 A1* | 2/2007 | Tanaya | 310/370 |
| 2009/0066191 A1* | 3/2009 | Tsuchido et al. | 310/353 |
| 2009/0167117 A1 | 7/2009 | Yasuike | |
| 2010/0117492 A1* | 5/2010 | Kawashima | 310/353 |
| 2011/0095657 A1* | 4/2011 | Yamashita et al. | 310/367 |

FOREIGN PATENT DOCUMENTS

| | | |
|---|---|---|
| JP | 59-040715 | 3/1984 |
| JP | 61-187116 | 11/1986 |
| JP | 09-326667 | 12/1997 |
| JP | 10-022771 | 1/1998 |
| JP | 2000-013169 A | 1/2000 |
| JP | 2000-332571 | 11/2000 |
| JP | 2002-246869 | 8/2002 |
| JP | 2004-088138 | 3/2004 |
| JP | 2004-165743 A | 6/2004 |
| JP | 2004-165798 | 6/2004 |
| JP | 2004-260695 A | 9/2004 |
| JP | 2005-020141 A | 1/2005 |
| JP | 2005-136705 | 5/2005 |
| JP | 2005-269628 A | 9/2005 |
| JP | 2006-157511 A | 6/2006 |
| JP | 2009-158999 | 7/2009 |
| JP | 2009-164824 | 7/2009 |
| JP | 2009-188483 | 8/2009 |
| JP | 2010-109527 | 5/2010 |
| JP | 2010-130123 | 6/2010 |

* cited by examiner

PIEZOELECTRIC VIBRATOR ELEMENT, PIEZOELECTRIC MODULE, AND ELECTRONIC DEVICE

BACKGROUND

1. Technical Field

The present invention relates to a piezoelectric vibrator element and a piezoelectric module using the same. More particularly, the invention relates to a technique of alleviating the effect on a vibrating portion of stress at a mounting position occurring after mounting.

2. Related Art

In the related art, as a method of mounting piezoelectric vibrator elements, there is known a method of applying a conductive adhesive agent to be bonded to a package. Such a method involves a heat treatment process such as drying for hardening the conductive adhesive agent. Thus, due to a difference in the linear expansion coefficients of the piezoelectric vibrator element, the package, and the conductive adhesive agent, strain remains in the bonded portion of the conductive adhesive agent after cooling. As a result, there is a problem in that stress, namely thermal strain, applied from the bonded portion to a vibrating portion causes an adverse effect on vibration.

Moreover, when the piezoelectric vibrator element is miniaturized, the resonance frequency of the piezoelectric vibrator element may change with time due to the residual stress resulting from the hardened adhesive agent applied to a supporting portion of the piezoelectric vibrator element. Alternatively, it may be necessary to decrease the area of an excitation electrode. As a result, there is a problem in that the electrical properties of the piezoelectric vibrator element deteriorate considerably. For example, the impedance may increase and it may be difficult to obtain favorable properties.

In view of the above problem, JP-A-9-326667 proposes a thickness-shear piezoelectric vibrator such as an AT-cut quartz crystal substrate having a rectangular and flat shape in which a notch or a slit is formed between a supporting portion and a vibrating portion.

FIGS. 21A to 21D show schematic views of a piezoelectric vibrator disclosed in JP-A-9-326667. FIG. 21A is a top view of a piezoelectric vibrator element of the piezoelectric vibrator, FIG. 21B is a bottom view of the piezoelectric vibrator element of the piezoelectric vibrator, FIG. 21C is a plan view of the piezoelectric vibrator in which the piezoelectric vibrator element is mounted inside a container, and FIG. 21D is a cross-sectional view taken along the line A-A' in FIG. 21C.

FIGS. 21A to 21D show a rectangular piezoelectric vibrator 600 including a supporting portion 602 and a vibrating portion 604. Excitation electrodes 606A and 606B are formed on the upper and lower surfaces of the vibrating portion 604 of the piezoelectric vibrator 600, respectively. Input and output terminal portions 608A and 608B are extracted to the edge of the supporting portion 602 of the piezoelectric vibrator 600 from the excitation electrodes 606A and 606B. A slit 610 is formed on the principal surface of the piezoelectric vibrator 600 between the excitation electrodes 606A and 606B and the input and output terminal portions 608A and 608B. In this way, a structure which physically isolates the excitation electrodes 606A and 606B from the input and output terminal portions 608A and 608B is realized.

In the above configuration, when an adhesive agent 616 for bonding and electrically connecting the supporting portion 602 of the piezoelectric vibrator 600 to a connection electrode (not shown) of a bottom portion 614 inside a container 612 storing the piezoelectric vibrator 600 is hardened, residual stress occurs in the piezoelectric vibrator 600 in the direction and range indicated by the two-dot chain line in FIG. 21C. However, in such a configuration, the slit 610 prevents the residual stress from propagating to the vibrating portion 604. Specifically, by setting the longitudinal length of the slit 610 to an optimal length, the propagation direction of the residual stress can be restricted to the outside of the region indicated by the two-dot chain line. In this way, it is possible to manufacture the compact piezoelectric vibrator 600 with a small change over time in the resonance frequency without deteriorating the electrical properties of the piezoelectric vibrator 600. As similar techniques, a configuration in which a slit is formed between the vibrating portion and a portion where a conductive adhesive agent is applied is disclosed in JP-A-59-040715, JP-UM-61-187116, JP-A-2004-165798, JP-A-2009-158999, and JP-A-2005-136705. Moreover, a configuration in which a notch is formed between the vibrating portion and the conductive adhesive agent applied portion is disclosed in JP-A-59-040715, JP-UM-61-187116, JP-A-2004-165798, JP-A-2009-158999, JP-B-4087186, JP-A-2009-188483, and JP-A-2010-130123. Furthermore, a configuration in which in order to secure rigidity or the like, a depression is formed at the central portion of a piezoelectric vibrator element to realize an inverted mesa structure is disclosed in JP-A-2000-332571, JP-A-2009-164824, and JP-A-2002-246869.

However, in recent years where miniaturization of devices using such a piezoelectric vibrator element and improvement in the performance thereof has advanced rapidly, it has been difficult to sufficiently eliminate the mounting strain with any of the above-described configurations, which is found by the present inventors as described below.

FIGS. 22A and 22B show a stress distribution when a slit is formed between a mount portion and a vibrating portion of a piezoelectric vibrator element. FIG. 22A shows a stress distribution when the width in the Z'-axis direction of the slit of the piezoelectric vibrator element is 150 μm, and FIG. 22B shows a stress distribution when the width in the Z'-axis direction of the slit of the piezoelectric vibrator element is 250 μm. Moreover, FIGS. 23A to 24B show stress distributions when a notch is formed on both sides in the width direction of the piezoelectric vibrator element at a position between the mount portion and the vibrating portion to thereby form a connecting portion that connects the mount portion and the vibrating portion together. FIG. 23A shows a stress distribution when the width in the X-axis direction of the connecting portion is 400 μm, and FIG. 23B shows a stress distribution when the width in the X-axis direction of the connecting portion is 300 μm. Moreover, FIG. 24A shows a stress distribution when the width in the X-axis direction of the connecting portion is 200 μm, and FIG. 24B shows a stress distribution when the width in the X-axis direction of the connecting portion is 100 μm.

FIGS. 22A to 24B show simulation results of a stress distribution when compressive stress or tensile stress is applied to a piezoelectric vibrator element 700 at two positions corresponding to the centers of two circles on the surface on the Y'-axis side of a mount portion 702 to which a conductive adhesive agent is applied in the drawings. The compressive stress or tensile stress (residual stress) occurs due to stress applied to the piezoelectric vibrator element resulting from a difference in the thermal expansion coefficients of the piezoelectric vibrator element, the conductive adhesive agent, and the substrate.

In FIGS. 22A to 24B, the X, Y', and Z' axes are assumed to be orthogonal to each other, and the piezoelectric vibrator element 700 has a planar outer shape which has principal surfaces normal to a direction parallel to the Y' axis and side edges in a direction parallel to the Z' axis and a direction parallel to the X axis. Moreover, a slit 704 is formed as a penetration hole penetrating through the principal surfaces of the piezoelectric vibrator element 700. Thus, in the piezoelectric vibrator element 700, the mount portion 702, the slit 704, and the vibrating portion 706 are arranged in a laterally parallel form. In FIGS. 22A and 22B, the piezoelectric vibrator element 700 has such an outer shape that the length in the arrangement direction (the Z'-axis direction) in which the mount portion 702, the slit 704, and the vibrating portion 706 are arranged is 1500 μm, and the width in the X-axis direction is 1000 μm. Moreover, the length in the X-axis direction (long side) of the slit 704 is 650 μm. In addition, the width in the Z'-axis direction from the long side of the slit 704 on the mount portion 702 side to the end portion of the mount portion 702 is 350 μm in FIG. 22A and is 250 μm in FIG. 22B. Moreover, the width in the Z'-axis direction of the slit 704 is 150 μm in FIG. 22A and is 250 μm in FIG. 22B. That is, the position and width in the Z'-axis direction of the slit 704 is changed between FIG. 22A and FIG. 22B.

Moreover, a plurality of patterns arranged in a vertical line to the left of the drawings of FIGS. 22A to 24B represents the intensity of stress applied to the piezoelectric vibrator element 700. The higher the pattern, the greater the stress, and the lower the pattern, the smaller the stress. Moreover, the distribution of the intensity of stress applied to the piezoelectric vibrator element 700 is depicted using the patterns described above.

As shown in FIGS. 22A and 22B, in such a compact piezoelectric vibrator element 700, it can be understood that even when the slit 704 is disposed, and moreover, the position and width of the slit 704 are changed, it is very difficult to eliminate stress resulting from the stress occurring in the mount portion 702, but strong stress reaches up to the vibrating portion 706 of the piezoelectric vibrator element 700. Thus, there is a problem in that the stress has an adverse effect on the electrical properties such as stability of the resonance frequency of the piezoelectric vibrator element 700.

A piezoelectric vibrator element 700 shown in FIGS. 23A to 24B has a so-called notch structure in which notches 708 are formed at both ends in the width direction of the piezoelectric vibrator element 700 at a position between the mount portion 702 and the vibrating portion 706 according to the related art disclosed in JP-A-2005-136705 and JP-B-4087186. In this structure, it can be understood that when the width of a connecting portion 710 formed by the notches 708 is decreased, the propagation of stress occurring in the mount portion 702 to the vibrating portion 706 is alleviated. However, a structure in which the vibrating portion 706 is supported by only the connecting portion 710 has drawbacks in terms of its strength such as drop impact resistance and lacks practical application.

SUMMARY

An advantage of some aspects of the invention is that it provides a piezoelectric vibrator element capable of sufficiently alleviating propagation of stress from a mount portion to a vibration region and a piezoelectric module using the piezoelectric vibrator element.

APPLICATION EXAMPLE 1

This application example of the invention is directed to a piezoelectric vibrator element including a vibrating portion, wherein a buffering portion and a mount portion are sequentially connected to a peripheral portion of the vibrating portion, wherein the buffering portion has a slit which is formed between the mount portion and the peripheral portion, and wherein the mount portion has notches which are formed at both end portions in a direction orthogonal to an arrangement direction of the mount portion, the buffering portion, and the peripheral portion.

With the above configuration, the slit can prevent stress occurring in the mount portion during mounting from propagating in a straight line to the vibrating portion. Thus, the stress from the mount portion propagates to the periphery of the slit and the buffering portion. Furthermore, with the above configuration, since the width of the mount portion is made narrower than the width of the buffering portion by the notches, the path of stress propagating to the positions of the buffering portion corresponding to the periphery of the slit is increased. Accordingly, it is possible to alleviate the stress propagating to the peripheral portion and the vibrating portion.

APPLICATION EXAMPLE 2

This application example of the invention is directed to the piezoelectric vibrator element of the above application example, wherein a notch is formed in a connecting portion between the buffering portion and the peripheral portion. With the above configuration, the propagation in a straight line to the vibrating portion, of the stress having propagated up to the periphery of the slit and the buffering portion of the piezoelectric vibrator element can be blocked by the notches. Thus, it is possible to alleviate the effect of stress to the vibrating portion.

APPLICATION EXAMPLE 3

This application example of the invention is directed to the piezoelectric vibrator element of the above application example, wherein the peripheral portion is a thick portion that is thicker than the vibrating portion, and the buffering portion and the mount portion re sequentially connected to the thick portion. With the above configuration, since a step portion is formed at the boundary between the thick peripheral portion and the vibrating portion, it is possible to reliably alleviate the stress at the step portion.

APPLICATION EXAMPLE 4

This application example of the invention is directed to the piezoelectric vibrator element of the above application example, wherein the width of the thick portion is narrower than the width of the buffering portion in relation to a direction orthogonal to an arrangement direction of the mount portion, the buffering portion, and the thick portion. With the above configuration, it is possible to decrease the weight on the free end side of the piezoelectric vibrator element and to improve the stability of mounting.

APPLICATION EXAMPLE 5

This application example of the invention is directed to the piezoelectric vibrator element of the above application example, wherein the piezoelectric vibrator element is formed of an AT-cut quartz crystal in which in an orthogonal coordinate system made up of the crystal axes of a quartz crystal, which are an X axis serving as an electrical axis, a Y axis serving as a mechanical axis, and a Z axis serving as an optical axis, an axis which is the Z axis tilted in a negative (−)

Y direction of the Y axis about the X axis is a Z' axis, and an axis which is the Y axis tilted in a positive (+) Z direction of the Z axis about the X axis is a Y' axis, the AT-cut quartz crystal being configured by a plane parallel to the X axis and the Z' axis, and in which a thickness direction thereof is a direction parallel to the Y' axis. With the above configuration, it is possible to obtain a piezoelectric vibrator element capable of efficiently oscillating thickness-shear vibration.

APPLICATION EXAMPLE 6

This application example of the invention is directed to the piezoelectric vibrator element of the above application example, wherein the thick portion is made thin except a portion that is connected to the buffering portion. With the above configuration, it is possible to decrease the weight on the free end side of the piezoelectric vibrator element and to improve the stability of mounting.

APPLICATION EXAMPLE 7

This application example of the invention is directed to the piezoelectric vibrator element of the above application example, wherein excitation electrodes for vibrating the vibrating portion are formed on both surfaces of the vibrating portion, a pair of extraction electrodes electrically connected to the respective excitation electrodes is formed on amounting surface of the mount portion, and the thin portion is connected to the thick portion by being shifted to the opposite side of the mounting surface. With the above configuration, a step is formed in the thickness direction at the mounting surface-side boundary between the thin portion and the thick portion. As a result, the distance between the conductive adhesive agent applied on the extraction electrodes and the vibrating portion increases by the amount corresponding to the step. Thus, it is possible to alleviate the stress reaching the vibrating portion even more.

APPLICATION EXAMPLE 8

This application example of the invention is directed to the piezoelectric vibrator element of the above application example, wherein the vibrating portion is thicker than the thin portion. With the above configuration, it is possible to allow thickness-shear vibration to be trapped in the vibrating portion and to improve excitation efficiency.

APPLICATION EXAMPLE 9

This application example of the invention is directed to a piezoelectric vibrator on which the piezoelectric vibrator element according to the above application example of the invention is mounted in a state where the mounting surface of the mount portion of the piezoelectric vibrator element faces a substrate, and the mount portion and the substrate are bonded to each other by a conductive adhesive agent. With the above configuration, it is possible to obtain a piezoelectric vibrator in which the stress to the vibrating portion is alleviated.

APPLICATION EXAMPLE 10

This application example of the invention is directed to an electronic device on which the piezoelectric vibrator element according to the above application example of the invention is mounted in a state where the mounting surface of the mount portion of the piezoelectric vibrator element faces a substrate, and the mount portion and the substrate are bonded to each other by a conductive adhesive agent. With the above configuration, it is possible to obtain an electronic device in which the stress to the vibrating portion is alleviated.

APPLICATION EXAMPLE 11

This application example of the invention is directed to the piezoelectric vibrator element of the above application example, wherein the peripheral portion is a thin portion that is thinner than the vibrating portion, and the buffering portion and the mount portion are sequentially connected to the thin portion.

With the above configuration, the slit can prevent stress occurring in the mount portion during mounting from propagating in a straight line to the vibrating portion. Thus, the stress from the mount portion propagates to the periphery of the slit and the buffering portion. Furthermore, with the above configuration, since the width of the mount portion is made narrower than the width of the buffering portion by the notches, the path of stress propagating to the positions of the buffering portion corresponding to the periphery of the slit is increased. Accordingly, it is possible to alleviate the stress propagating to the peripheral portion and the vibrating portion. On the other hand, the piezoelectric vibrator element of the above application example of the invention has a mesa structure in which the thickness of the vibrating portion is thicker than the peripheral portion. Thus, although the stress having circled around the positions of the buffering portion corresponding to the periphery of the slit can reach the vibrating portion through the peripheral portion, since a step realized by the mesa structure is formed between the principal surface of the peripheral portion and the principal surface of the vibrating portion, it is possible to alleviate the stress at the step position. Therefore, the stress is sufficiently alleviated before it propagates to the vibrating portion. As a result, it is possible to alleviate the effect of the stress to the vibrating portion.

BRIEF DESCRIPTION OF THE DRAWINGS

The invention will be described with reference to the accompanying drawings, wherein like numbers reference like elements.

FIGS. 1A to 1C are schematic views of a piezoelectric vibrator element according to a first embodiment, in which FIG. 1A is a plan view, FIG. 1B is a bottom view, and FIG. 1C shows the cut angle of a quartz crystal substrate.

FIGS. 2A to 2D are schematic views of the piezoelectric vibrator element according to the first embodiment, in which FIG. 2A is a front view, FIG. 2B is a rear view, and FIG. 2C is a cross-sectional view taken along the line A-A in FIG. 1A.

FIGS. 6A to 6D are schematic views of a piezoelectric vibrator element according to a second embodiment, in which FIG. 6A is a plan view, FIG. 6B is a bottom view, FIG. 6C is a cross-sectional view taken along the line A-A in FIG. 6A, and FIG. 6D is a cross-sectional view taken along the line B-B in FIG. 6A.

FIGS. 7A to 7C are views showing a modified example of the piezoelectric vibrator element according to the first embodiment, in which FIG. 7A is a plan view, FIG. 7B is a bottom view, and FIG. 7C is a side view.

FIGS. 8A to 8C are views showing a first modified example of the piezoelectric vibrator element according to the second embodiment, in which FIG. 8A is a plan view, FIG. 8B is a bottom view, and FIG. 8C is a side view.

FIGS. 9A to 9D are schematic views showing a second modified example of the piezoelectric vibrator element according to the second embodiment, in which FIG. 9A is a plan view, FIG. 9B is a bottom view, FIG. 9C is a cross-sectional view taken along the line A-A in FIG. 9A, and FIG. 9D is a cross-sectional view taken along the line B-B in FIG. 9A.

FIGS. 10A to 10D are schematic views of a piezoelectric vibrator element according to a third embodiment, in which FIG. 10A is a plan view, FIG. 10B is a bottom view, FIG. 10C is a cross-sectional view taken along the line A-A in FIG. 10A, and FIG. 10D is a cross-sectional view taken along the line B-B in FIG. 10A.

FIGS. 12A to 12D are schematic views of a piezoelectric vibrator element according to a fourth embodiment, in which FIG. 12A is a plan view, FIG. 12B is a bottom view, FIG. 12C is a cross-sectional view taken along the line A-A in FIG. 12A, and FIG. 12D is a cross-sectional view taken along the line B-B in FIG. 12A.

FIGS. 15A and 15B are views showing a piezoelectric vibrator on which the piezoelectric vibrator element according to the present embodiment is mounted, in which FIG. 15A is a plan view of the piezoelectric vibrator when the piezoelectric vibrator element shown in FIGS. 6A to 6D is mounted thereon, and FIG. 15B is a cross-sectional view taken along the line A-A in FIG. 15A.

FIGS. 17A and 17B are views showing a piezoelectric module on which the piezoelectric vibrator element according to the present embodiment is mounted, in which FIG. 17A is a cross-sectional view taken along the line A-A in FIG. 16, and FIG. 17B is a cross-sectional view taken along the line A-A in FIG. 16 when the piezoelectric vibrator element shown in FIGS. 9A to 9D is mounted thereon.

FIGS. 19A and 19B are views showing a second modified example of the piezoelectric module according to the present embodiment, in which FIG. 19A is a side view, and FIG. 19B is a plan view of a substrate that constitutes the piezoelectric module.

FIGS. 20A and 20B are views showing a third modified example of the piezoelectric module according to the present embodiment, in which FIG. 20A is a schematic view of a piezoelectric module in which the cross-section of a container has a so-called H-shaped structure, and FIG. 20B is a schematic view of a single side-sealed piezoelectric module.

FIGS. 21A to 21D are schematic views of a piezoelectric vibrator disclosed in JP-A-9-326667, in which FIG. 21A is a top view of a piezoelectric vibrator element that constitutes the piezoelectric vibrator, FIG. 21B is a bottom view of the piezoelectric vibrator element that constitutes the piezoelectric vibrator, FIG. 21C is a plan view of the piezoelectric vibrator in which the piezoelectric vibrator element is mounted inside a container, and FIG. 21D is a cross-sectional view taken along the line A-A' in FIG. 21C.

FIGS. 22A and 22B are views showing stress distribution when a slit is formed between a mount portion and a vibrating portion of a piezoelectric vibrator element, in which FIG. 22A shows stress distribution when the width of the slit of the piezoelectric vibrator element is 150 μm, and FIG. 22B shows stress distribution when the width of the slit of the piezoelectric vibrator element is 250 μm.

FIGS. 23A and 23B are views showing stress distribution when a notch is formed on both sides in the width direction of a piezoelectric vibrator element at a position between the mount portion and the vibrating portion to thereby form a connecting portion that connects the mount portion and the vibrating portion, in which FIG. 23A shows stress distribution when the width of the connecting portion is 400 μm, and FIG. 23B shows stress distribution when the width of the connecting portion is 300 μm.

FIGS. 24A and 24B are views showing a stress distribution when a notch is formed on both sides in the width direction of a piezoelectric vibrator element at a position between the mount portion and the vibrating portion to thereby form a connecting portion that connects the mount portion and the vibrating portion, in which FIG. 24A shows a stress distribution when the width of the connecting portion is 200 μm, and FIG. 24B shows a stress distribution when the width of the connecting portion is 100 μm.

DESCRIPTION OF EXEMPLARY EMBODIMENTS

Figure 1A:
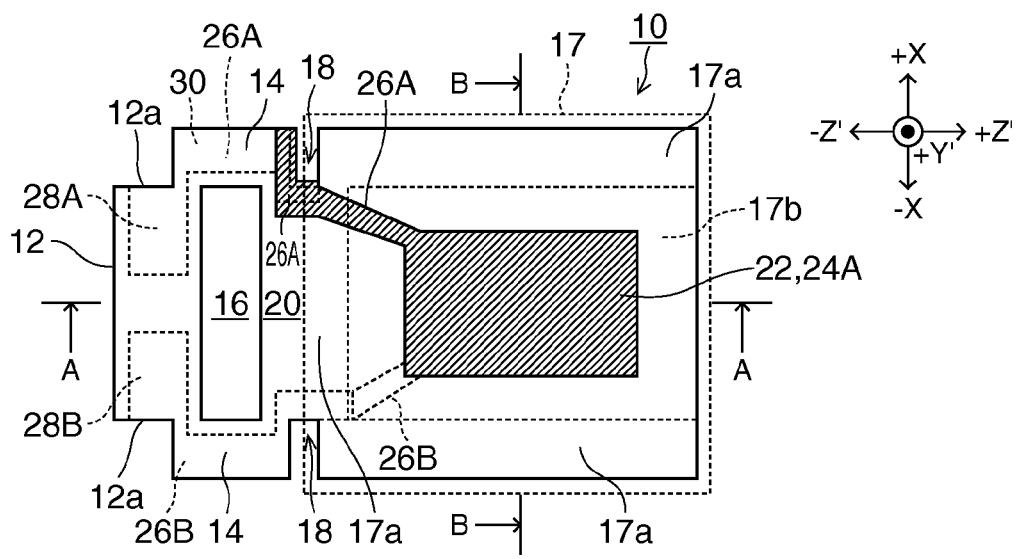

Hereinafter, the invention will be described in detail below with reference to embodiments shown in the accompanying drawings. Note that constituent elements, types, combinations, shapes, relative positions, and the like described in the embodiments are not intended to limit the range of this invention, but are only examples unless there is a specific statement. In the drawings used in the following description, the X, Y', and Z' axes are assumed to be orthogonal to each other.

Figure 1B:
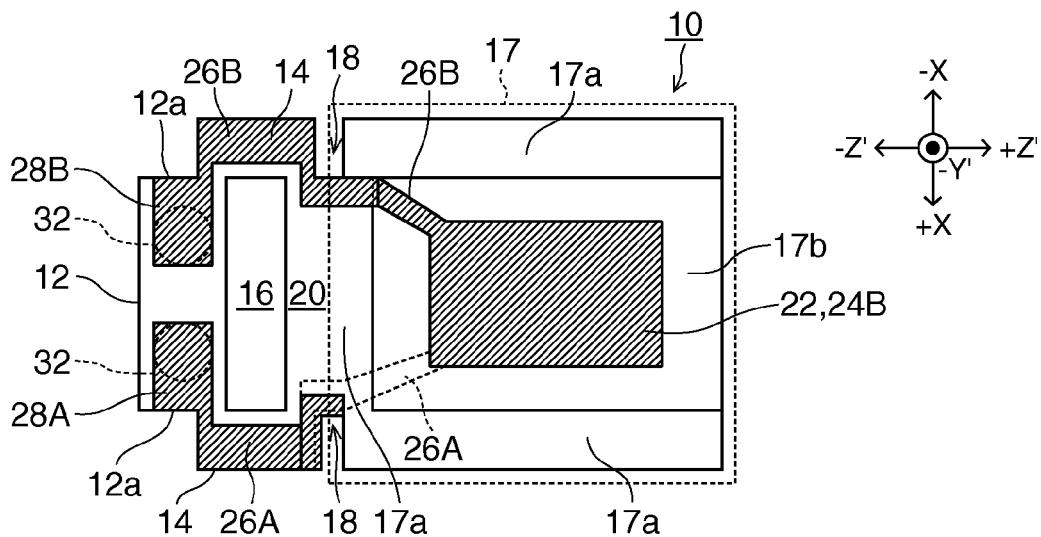
Figure 1C:
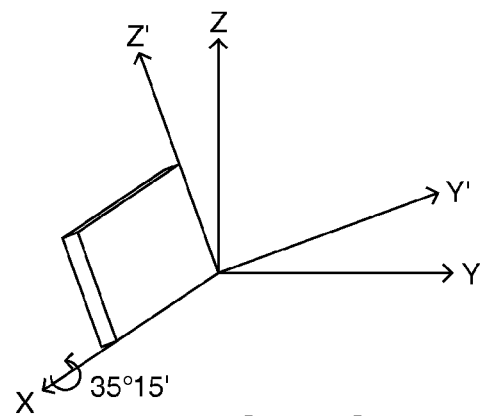
Figure 2A:
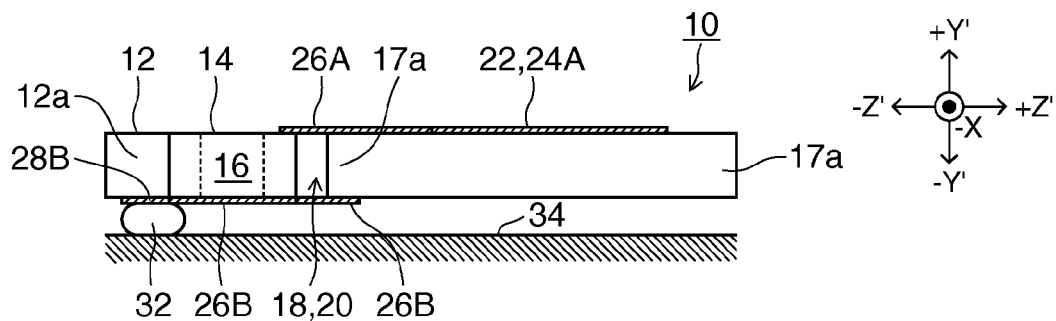
Figure 2B:
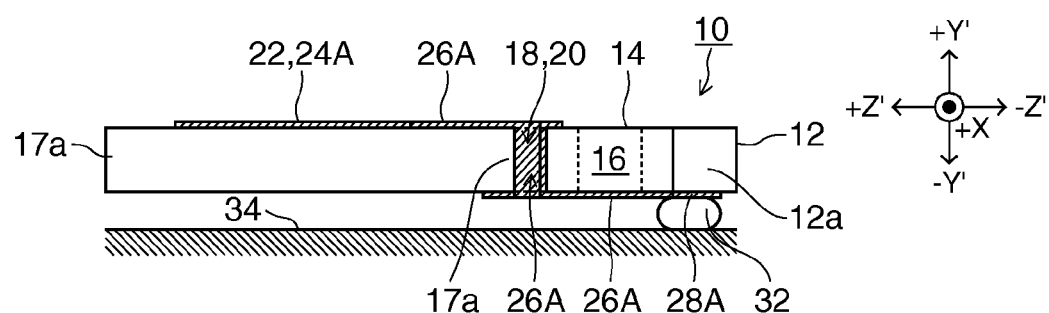
Figure 2C:
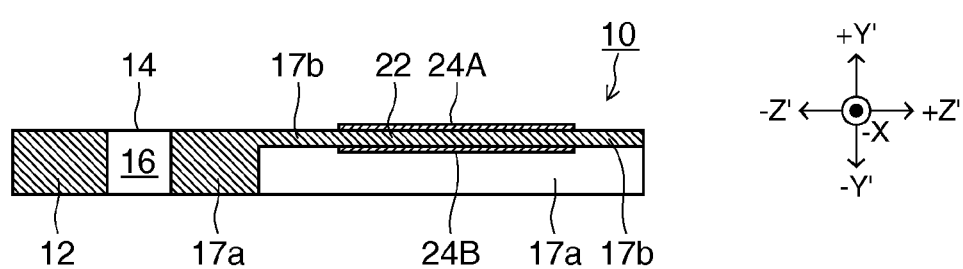
Figure 2D:
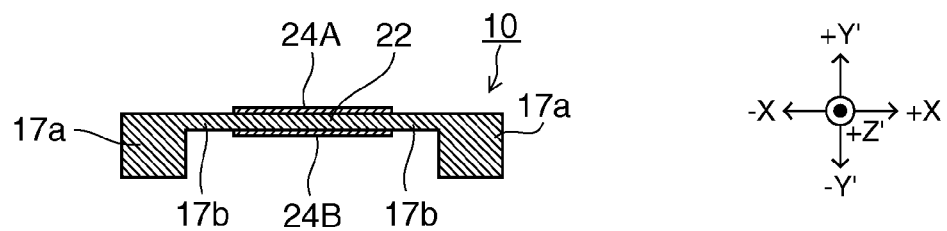

A piezoelectric vibrator element according to the first embodiment is shown in FIGS. 1A to 2C. FIG. 1A is a plan view, FIG. 1B is a bottom view, and FIG. 1C is a view showing the cut angle of a quartz crystal substrate. FIG. 2A is a front view, FIG. 2B is a rear view, and FIG. 2C is a cross-sectional view taken along the line A-A in FIG. 1A. A piezoelectric vibrator element 10 according to the present embodiment is formed of an AT-cut quartz crystal substrate in which in an orthogonal coordinate system made up of the crystal axes of a quartz crystal, which are an X axis serving as an electrical axis, a Y axis serving as a mechanical axis, and a Z axis serving as an optical axis, an axis which is the Z axis tilted in a negative (−) Y direction of the Y axis about the X axis is a Z' axis, and an axis which is the Y axis tilted in a positive (+) Z direction of the Z axis about the X axis is a Y' axis, the AT-cut quartz crystal substrate being configured by a plane parallel to the X axis and the Z' axis, and in which a thickness direction thereof is a direction parallel to the Y' axis. Moreover, a rectangular AT-cut quartz crystal substrate is subjected to wet-etching while leaving a peripheral portion 17 (reinforcing portion) at the periphery thereof. In this way, the outer shape of the piezoelectric vibrator element 10 is formed so that the short-side direction thereof is the X-axis direction, and the long-side direction thereof is the Z'-axis direction.

Moreover, a thin vibrating portion 22 thinner than the peripheral portion 17 (first peripheral portion 17a) is formed to obtain the piezoelectric vibrator element 10 having an inverted mesa structure.

In the piezoelectric vibrator element 10, a mount portion 12, a buffering portion 14 having a slit 16, and the peripheral portion 17 having the vibrating portion 22 at the central part thereof are integrated with each other, and the entire outer shape thereof is formed. The mount portion 12 and the peripheral portion 17 are disposed at the end portions in the long-side direction (Z'-axis direction) of the piezoelectric vibrator element 10, respectively. The buffering portion 14 is disposed between the mount portion 12 and the peripheral portion 17. Moreover, the piezoelectric vibrator element 10 has a shape such that it is bilaterally symmetrical about the line A-A in FIG. 1A as the central line. Moreover, the piezoelectric vibrator element 10 is supported in a cantilevered form such that the mount portion 12 side is a fixed end, and the vibrating portion 22 side is a free end. In such a state, the piezoelectric vibrator element 10 is fixed to a mounting substrate 34 (see FIGS. 2A to 2D) of a mounting destination by a conductive adhesive agent 32.

The mount portion 12 is disposed at one end in the Z'-axis direction of the piezoelectric vibrator element 10, and notches 12a are formed at both ends in the X-axis direction of the piezoelectric vibrator element 10. The notches 12a are disposed so that both ends in the X-axis direction of the mount portion 12 are notched in a rectangular shape. With the notches 12a, it is possible to narrow the gap between the application positions of the conductive adhesive agent 32 and to decrease a stress occurring region where stress occurs in the mount portion 12 during mounting. Moreover, pad electrodes 28A and 28B which are electrically connected to excitation electrodes 24A and 24B described later are formed on one principal surface (a negative (−) Y' axis-side surface) of the mount portion 12 serving as a mounting surface. Furthermore, the conductive adhesive agent 32 for bonding with the mounting substrate 34 on the mounting side is applied to the pad electrodes 28A and 28B. Thus, by bonding the piezoelectric vibrator element 10 to the mounting substrate 34 using the conductive adhesive agent 32, a piezoelectric vibrator is formed.

The buffering portion 14 is formed between the mount portion 12 and the peripheral portion 17 so as to alleviate stress (thermal strain) which occurs in the mount portion 12 and propagates toward the vibrating portion 22 side. To realize this, a slit 16 is formed in the buffering portion 14, and notches 18 are formed between the buffering portion 14 and the peripheral portion 17. In addition, extraction electrodes 26A and 26B described later are formed on the buffering portion 14.

The slit 16 is formed as a rectangular penetration hole which has a long side extending in the short-side direction (X-axis direction) of the piezoelectric vibrator element 10 and a short side extending in the long-side direction (Z'-axis direction) of the piezoelectric vibrator element 10, and which penetrates through the piezoelectric vibrator element 10 in the thickness direction thereof. AS will be described later, the slit 16 blocks propagation in a straight line of the stress occurring in the mount portion 12 during mounting of the piezoelectric vibrator element 10 to the mounting substrate 34 in the Z-axis direction (the long-side direction of the piezoelectric vibrator element 10) to thereby decrease the stress reaching the vibrating portion 22. On the other hand, the stress (thermal strain) during mounting of the piezoelectric vibrator element 10 occurs in a region which is located on the line connecting the application positions of the conductive adhesive agent 32 on the mount portion 12. Therefore, by setting the width in the long-side direction of the slit 16 to be larger than the gap between the application positions of the conductive adhesive agent 32 and disposing the slit 16 so as to cross the straight line connecting the occurrence region and the vibrating portion 22, it is possible to block the path of propagation in a straight line of the stress occurring in the occurrence region toward the vibrating portion 22 side. In particular, as shown in FIGS. 1A to 1C, by setting the width in the long-side direction of the slit 16 to be larger than the width in the X-axis direction of the mount portion 12 and disposing the slit 16 so that both end portions of the long side of the slit 16 as viewed from the Z'-axis direction protrude further from both end portions in the X-axis direction of the mount portion 12, it is possible to reliably block the propagation path of the stress occurring in the mount portion 12 toward the vibrating portion 22 side. With the above configuration, the path of propagation in a straight line to the vibrating portion 22, of the stress occurring in the above-described occurrence region (the mount portion 12) is blocked by the slit 16, so that the stress circles around the positions of the buffering portion 14 corresponding to the periphery of the slit 16.

The notches 18 are disposed at a position corresponding to the boundary (connecting portion) between the buffering portion 14 and the peripheral portion 17 so that the buffering portion 14 and the peripheral portion 17 (the first peripheral portion 17a) are notched from both sides in the short-side direction (the X-axis direction) of the piezoelectric vibrator element 10. Thus, a region of the buffering portion 14 and the peripheral portion 17 (the first peripheral portion 17a) interposed by the notches 18 becomes a neck portion 20. The notches 18 are disposed in order to block a path of propagation in a straight line to the vibrating portion 22, of stress having propagated to a position corresponding to the periphery of both ends of the buffering portion 14 in the long-side direction of the slit 16. Thus, it is preferable to set the width in the X-axis direction of the neck portion 20 formed by the notches 18 to be the same as, or equal to or smaller than, the width in the long-side direction (the X-axis direction) of the slit 16. Therefore, the stress having propagated to the above-described position propagates to the vibrating portion 22 side through the neck portion 20 since the direct propagation to the vibrating portion 22 is blocked by the notches 18.

The peripheral portion 17 is a member that constitutes the positive (+) Z-axis side of the piezoelectric vibrator element 10 and supports the vibrating portion 22. The peripheral portion 17 includes the first peripheral portion 17a connected to the buffering portion 14 and a second peripheral portion 17b which is disposed so as to surround the periphery of the vibrating portion 22 and is connected to the first peripheral portion 17a. Here, the first peripheral portion 17a has the same thickness as the buffering portion 14, and the second peripheral portion 17b has the same thickness as the vibrating portion 22. In FIGS. 1A to 1C, although the positive (+) Z'-axis side of the first peripheral portion 17a is notched, and the end surface on the positive (+) Z'-axis side of the second peripheral portion 17b is exposed, the first peripheral portion 17a may be disposed in that portion so that the periphery of the second peripheral portion 17b is completely surrounded by the first peripheral portion 17a. In the present embodiment, the first peripheral portion 17a has the same thickness as the buffering portion 14 and does not have a step, and the second peripheral portion 17b has the same thickness as the vibrating portion 22 and does not have a step. Moreover, the second peripheral portion 17b and the vibrating portion 22 are thinner than the first peripheral portion 17a and are connected to the first peripheral portion 17a in a manner of being recessed from the negative (−) Y'-axis direction of the piezoelectric vibrator element 10.

The vibrating portion 22 is a portion which is disposed so as to be surrounded by the second peripheral portion 17b and which produces thickness-shear vibration in the piezoelectric vibrator element 10. The excitation electrodes 24A and 24B are formed on both principal surfaces (the top and bottom surfaces) at the center of the vibrating portion 22 so as to face each other. The extraction electrode 26A is extracted from the excitation electrode 24A formed on the positive (+) Y-axis-side surface. The extraction electrode 26A is disposed so as to extend over the vibrating portion 22, the second peripheral portion 17b, the first peripheral portion 17a, and the buffering portion 14. The extraction electrode 26A is extracted to the surfaces of the notches 18 on the negative (−) Y'-axis side of the piezoelectric vibrator element 10 and connected to the pad electrode 28A through the buffering portion 14 and the mount portion 12. Moreover, the extraction electrode 26B is extracted from the excitation electrode 24B formed on the negative (−) Y'-axis-side surface. The extraction electrode 26B is disposed so as to extend over the vibrating portion 22, the second peripheral portion 17b, the first peripheral portion 17a, the buffering portion 14, and the mount portion 12 and connected to the pad electrode 28B. Thus, by applying an AC voltage to the pad electrodes 28A and 28B, the vibrating portion 22 can perform thickness-shear vibration at a predetermined frequency.

However, in the step of bonding the piezoelectric vibrator element 10 using the conductive adhesive agent 32, it is necessary to expose the piezoelectric vibrator element 10 to high temperature in order to harden the conductive adhesive agent 32. Thus, when temperature decreases after the bonding, the above-described stress (thermal strain) occurs in the region of the mount portion 12 connecting the two application positions of the conductive adhesive agent 32 due to a difference in the thermal expansion coefficients of the piezoelectric vibrator element 10, the mounting substrate 34, and the conductive adhesive agent 32. The stress propagates to the entire piezoelectric vibrator element 10.

On the other hand, when stress is applied to the vibrating portion 22, since the apparent rigidity of the vibrating portion 22 changes, the resonance frequency varies. Moreover, since the mounting state in the mount portion 12 is different from one piezoelectric vibrator element to another depending on the mounting state of the piezoelectric vibrator element 10, the stress propagating to the vibrating portion 22 also becomes uneven. Thus, the resonance frequency becomes uneven.

However, in the mount portion 12, the bonding positions of the conductive adhesive agent 32 are next to each other due to the notches 12a. Thus, it is possible to restrict the stress occurrence range to the region where the conductive adhesive agent 32 is applied to thereby decrease the stress occurrence region and suppress the components of stress propagating to the other regions. Moreover, although the stress occurring in the bonding positions of the conductive adhesive agent 32 propagates in a straight line toward the buffering portion 14 side (the Z'-axis direction), the path of propagation in a straight line is blocked by the slit 16, and as a result, the stress propagates along the periphery of the slit 16. Thus, the path along which the stress propagates through the periphery of the slit 16 increases. Furthermore, since the bonding positions of the conductive adhesive agent 32 in the mount portion 12 are next to the central side of the long side of the slit 16 due to the notches 12a, the path along which the stress circles around the periphery of the slit 16 increases further. Therefore, the stress is sufficiently alleviated before propagating to the vibrating portion 22, and the effect of the stress on the vibrating portion 22 can be alleviated. Furthermore, since the slit 16 can bend the propagation path as well as lengthening the propagation path of the stress, it is possible to facilitate alleviation of the stress.

Moreover, the path of propagation in a straight line to the vibrating portion 22, of the stress having propagated to both ends in the X-axis direction of the buffering portion 14 is blocked by the notches 18, and the stress propagates to the positions of the buffering portion 14 around the slit 16 on the first peripheral portion 17a side and the neck portion 20. Thus, since the propagation path of the stress is extended and bent in the above-described manner, it is possible to alleviate the stress propagating to the vibrating portion 22.

Moreover, the second peripheral portion 17b and the vibrating portion 22 are thinner than the first peripheral portion 17a. With this configuration, since the vibrating portion 22 receives only a part of the stress having propagated to the first peripheral portion 17a, it is possible to decrease the stress propagating to the vibrating portion 22. Furthermore, the piezoelectric vibrator element 10 according to the present embodiment has a so-called inverted mesa structure in which the vibrating portion 22 (the second peripheral portion 17b) is thinner than the first peripheral portion 17a. Thus, although the stress having propagated to the buffering portion 14 (the neck portion 20) can reach the vibrating portion 22 through the first peripheral portion 17a and the second peripheral portion 17b, since a step resulting from the inverted mesa structure is formed between the principal surface of the first peripheral portion 17a and the principal surface (the principal surface of the vibrating portion 22) of the second peripheral portion 17b, it is possible to alleviate stress at this step position as will be described later (see FIG. 14). Furthermore, as shown in FIGS. 1A to 1C, the second peripheral portion 17b and the vibrating portion 22 are disposed in a manner of being recessed from the side (the negative (−) Y'-axis side) of the peripheral portion 17 where the conductive adhesive agent 32 is applied by half-etching. Therefore, in a state where the connection position between the first peripheral portion 17a and the second peripheral portion 17b (the vibrating portion 22) is shifted to the side (the positive (+) Y'-axis side) opposite the side (the negative (−) Y'-axis side) of the piezoelectric vibrator element 10 where the pad electrodes 28A and 28B are disposed, a step is formed between the principal surface of the vibrating portion 22 and the principal surface of the first peripheral portion 17a. As a result, the distance between the conductive adhesive agent 32 applied on the pad electrode 28A and 28B and the vibrating portion 22 increases by the amount corresponding to the above-described step. Thus, it is possible to alleviate the stress propagating to the vibrating portion 22 even more.

As above, in the piezoelectric vibrator element 10, by narrowing the width of the mount portion 12 using the notches 12a, the stress occurrence region in the mount portion 12 is decreased to decrease the occurring stress itself. Moreover, the path of propagation in a straight line to the vibrating portion 22, of the stress occurring in the mount portion 12 is blocked by the slit 16, so that the stress circles around the positions of the buffering portion 14 corresponding to the periphery of the slit 16. In addition, the path of the stress is bent to thereby facilitate alleviation of the stress. Furthermore, the path of propagation in a straight line to the vibrating portion 22, of the stress having reached the periphery of the buffering portion 14 at both ends in the long-side direction of the slit 16 is blocked by the notches 18, so that the stress circles around the neck portion 20 on the vibrating portion 22 side of the buffering portion 14 around the slit 16. In addition, the path of the stress is bent to facilitate alleviation of the stress. Finally, the stress having reached the neck portion 20 (the first peripheral portion 17a) is alleviated by the step formed between the principal surface of the first peripheral portion 17a and the principal surface (the principal surface of the vibrating portion 22) of the second peripheral portion 17b. Thus, the stress which can occur in the mount portion 12 during mounting of the piezoelectric vibrator element 10 is reduced in its amount by the notches 12a and alleviated by causing it to circle around the periphery of the slit 16 and the neck portion 20, and is finally alleviated at the boundary between the first peripheral portion 17a and the second peripheral portion 17b. In this way, it is possible to alleviate the stress propagating to the vibrating portion 22 to suppress frequency variation to thereby suppress unevenness in the properties such as the resonance frequency and the Q value of the piezoelectric vibrator using the piezoelectric vibrator element 10 and improve the yield.

Next, the step of manufacturing the piezoelectric vibrator element according to the first embodiment will be described.

FIGS. 3A to 3E show the step (vibrating portion forming step) of manufacturing the piezoelectric vibrator element, FIGS. 4A to 4E show the step (outer shape forming step) of manufacturing the piezoelectric vibrator element, and FIGS. 5A to 5F shows the step (electrode forming step) of manufacturing the piezoelectric vibrator element. Roughly, the manufacturing step involves the following procedures. First, a position of the quartz crystal substrate 36 used as the material of the piezoelectric vibrator element 10 corresponding to the vibrating portion 22 (the second peripheral portion 17b) is half-etched. Subsequently, etching is performed so as to form the outer shape of the piezoelectric vibrator element 10. Then, the excitation electrodes 24A and 24B, the extraction electrodes 26A and 26B, and the pad electrodes 28A and 28B are formed.

Figure 3A:
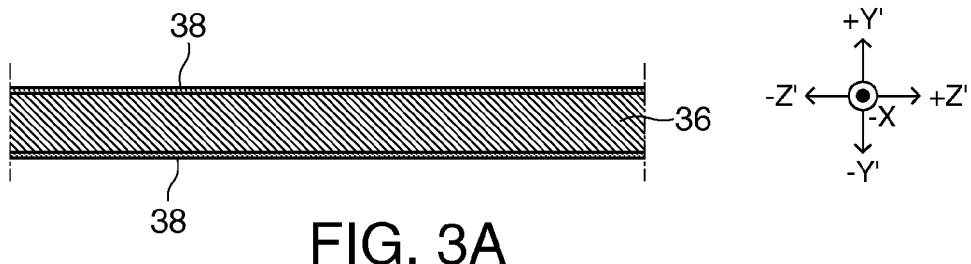
FIGS. 3A to 3E are schematic views showing the step (vibrating portion forming step) of manufacturing the piezoelectric vibrator element.
Figure 3B:
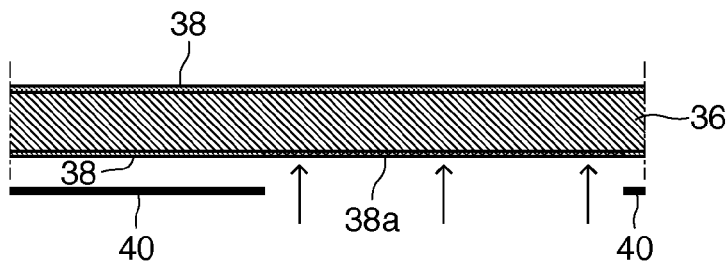
Figure 3C:
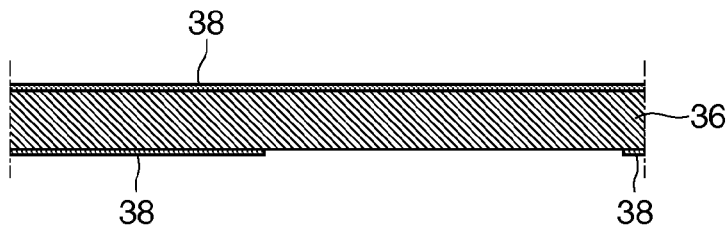
Figure 3D:
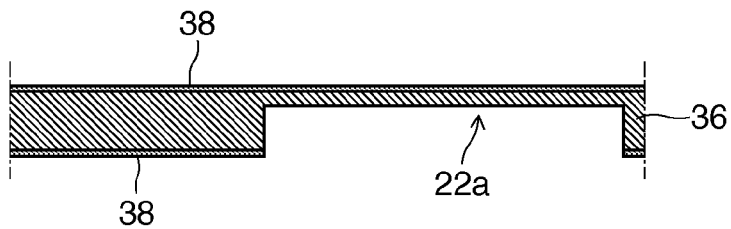
Figure 3E:
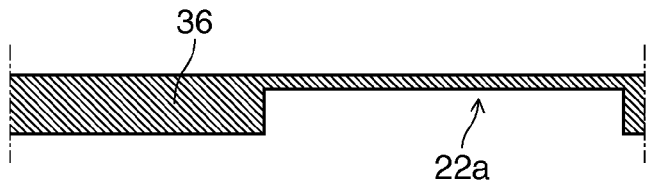

Specifically, as shown in FIGS. 3A to 3E, first, the outer shape of the vibrating portion 22 (the second peripheral portion 17b) which constitutes the piezoelectric vibrator element 10 is formed. First, as shown in FIG. 3A, the AT-cut quartz crystal substrate 36 used as a piezoelectric substrate is prepared, and a resist film 38 is applied on the quartz crystal substrate 36. Moreover, as shown in FIG. 3B, the resist film 38 is exposed using a photomask 40 corresponding to the shape of the vibrating portion 22 (the second peripheral portion 17b), and an exposed resist film 38a is removed as shown in FIG. 3C. Moreover, as shown in FIG. 3D, the quartz crystal substrate 36 is half-etched until the exposed portion of the quartz crystal substrate 36 has the same thickness as the vibrating portion 22 (the second peripheral portion 17b), and the resist film 38 is removed as shown in FIG. 3E. In this case, a recess portion 22a corresponding to the vibrating portion 22 and the second peripheral portion 17b is formed in the quartz crystal substrate 36.

Figure 4A:
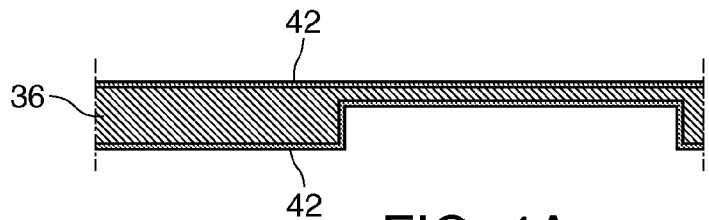
FIGS. 4A to 4E are schematic views showing the step (outer shape forming step) of manufacturing the piezoelectric vibrator element.
Figure 4B:
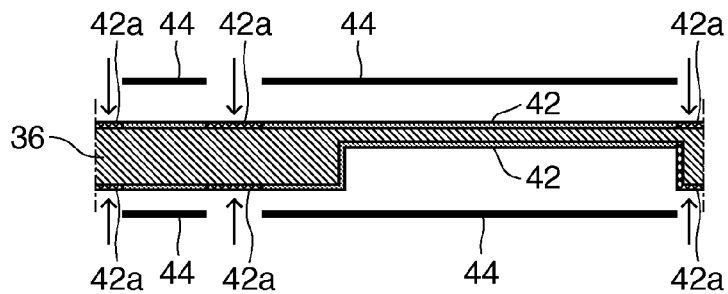
Figure 4C:
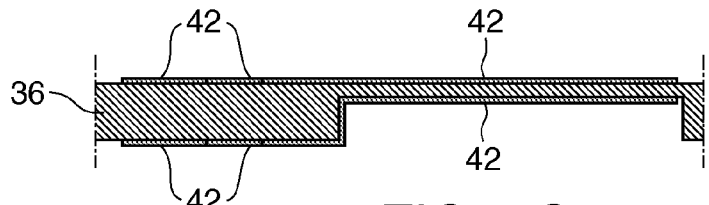
Figure 4D:
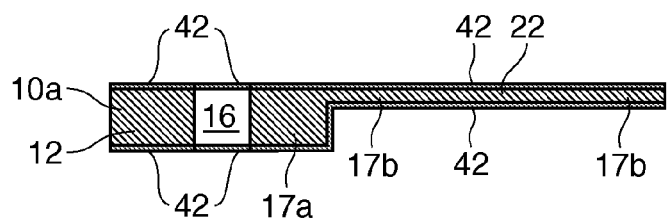
Figure 4E:
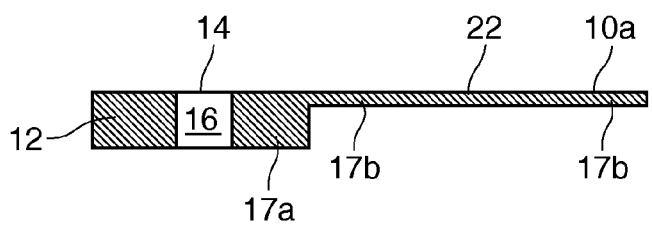

Subsequently, the outer shape of the piezoelectric vibrator element 10 is formed. As shown in FIG. 4A, a resist film 42 is applied on the quartz crystal substrate 36 in which the recess portion 22a is formed. Moreover, as shown in FIG. 4B, the resist film 42 is exposed using a photomask 44 corresponding to the shape of the piezoelectric vibrator element 10, the slit 16, and the notches 18, and the exposed resist film 42a is removed as shown in FIG. 4C. Moreover, as shown in FIG. 4D, the quartz crystal substrate 36 is etched until the exposed portion of the quartz crystal substrate 36 is penetrated, and the resist film 42 is removed as shown in FIG. 4E. In this way, a piezoelectric element substrate 10a having the outer shape of the piezoelectric vibrator element 10 is formed.

Figure 5A:
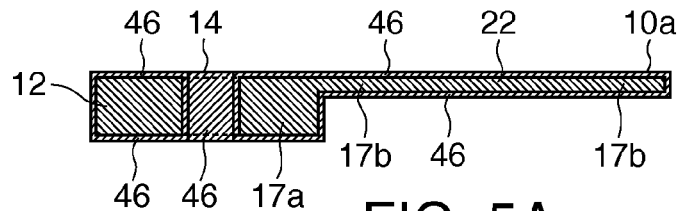
FIGS. 5A to 5F are schematic views showing the step (electrode forming step) of manufacturing the piezoelectric vibrator element.
Figure 5A:
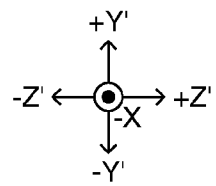
Figure 5B:
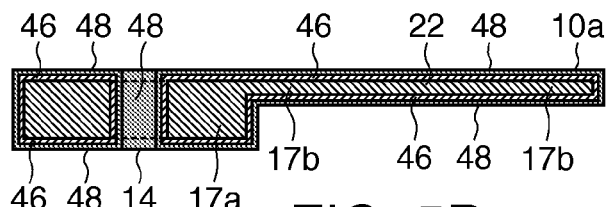
Figure 5C:
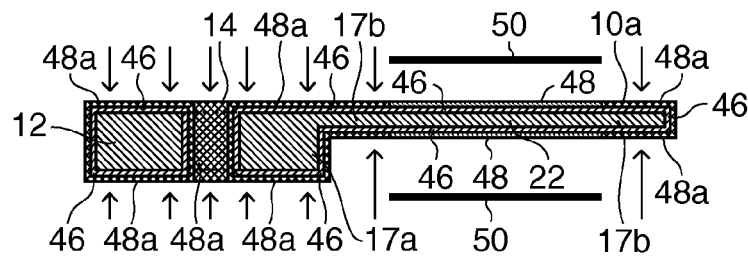
Figure 5D:
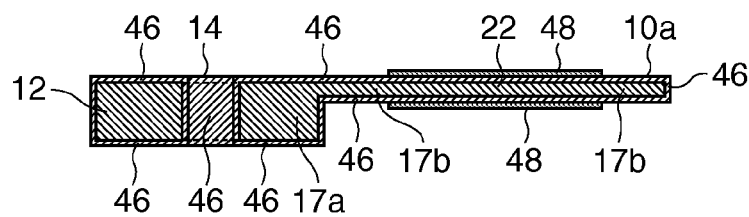
Figure 5E:
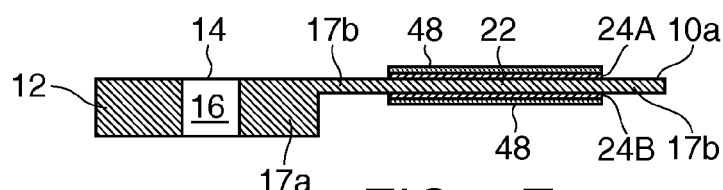
Figure 5F:
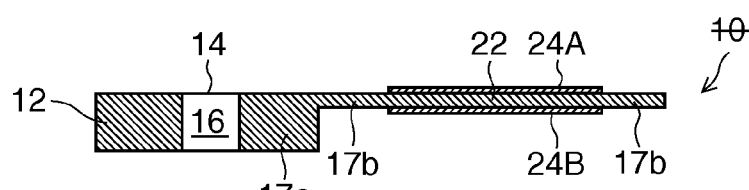

Moreover, electrodes are formed on the piezoelectric element substrate 10a. First, as shown in FIG. 5A, a metal film 46 made of Cr or Au is deposited on the entire surface of the piezoelectric element substrate 10a by sputtering or the like. In this case, the metal film 46 is also deposited on the end surfaces of the piezoelectric element substrate 10a. Moreover, as shown in FIG. 5B, a resist film 48 is applied on the entire surface of the piezoelectric element substrate 10a on which the metal film 46 is deposited. In this case, the resist film 48 is also applied on the end surfaces of the piezoelectric element substrate 10a. Subsequently, as shown in FIG. 5C, the resist film 48 is exposed using a photomask 50 corresponding to the shape of the excitation electrodes 24A and 24B, the extraction electrodes 26A and 26B (not shown in FIGS. 5A to 5F), and the pad electrodes 28A and 28B (not shown in FIGS. 5A to 5F) on both surfaces of the piezoelectric vibrator element 10. In this case, the resist film 48 covering a portion of the extraction electrode 26A passing the end surfaces of the piezoelectric vibrator element 10 is not exposed. Subsequently, as shown in FIG. 5D, an exposed resist film 48a is removed, and etching is performed while exposing the metal film 46 outside the portions corresponding to the excitation electrodes 24A and 24B, the extraction electrodes 26A and 26B, and the pad electrodes 28A and 28B as shown in FIG. 5E. In this case, the metal film 46 deposited on the end surfaces is protected by the resist film 42 which remains unexposed. Thus, the metal film 46 in the portion of the extraction electrode 26A passing the end surfaces remains, and electrical connection between the pad electrode 28A and the excitation electrode 24A on the opposite surface through the extraction electrode 26A is maintained. Moreover, as shown in FIG. 5F, the resist film 48 is removed, whereby the piezoelectric vibrator element 10 is formed.

Figure 6A:
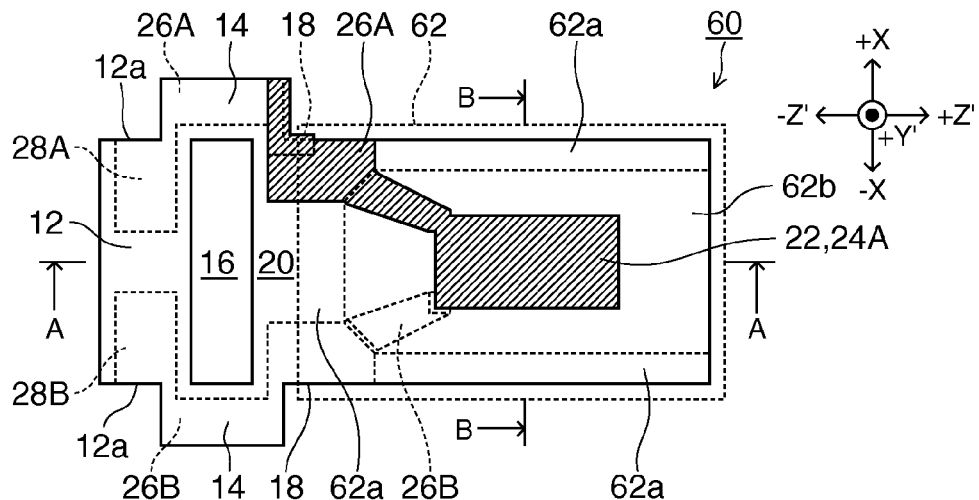
Figure 6B:
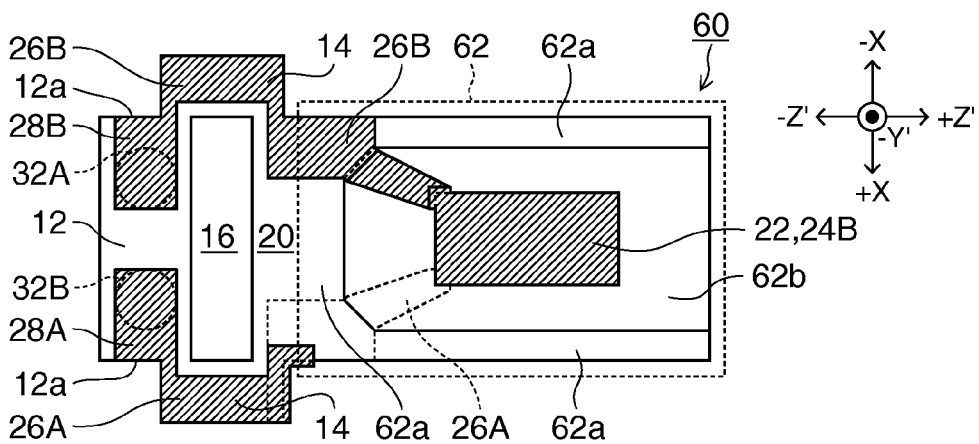
Figure 6C:
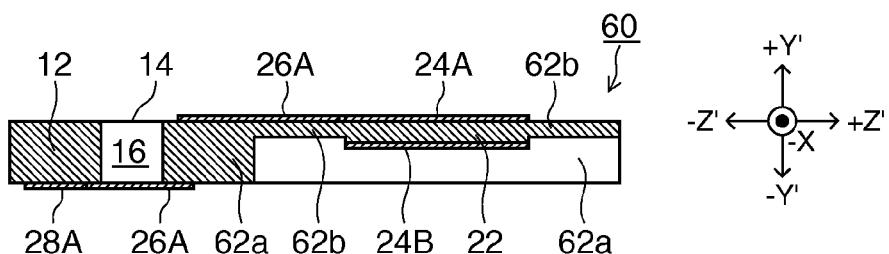
Figure 6D:
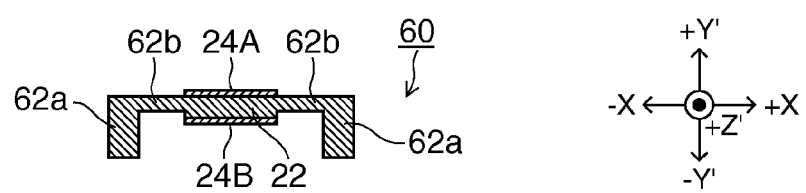

FIGS. 6A to 6D show a piezoelectric vibrator element according to the second embodiment, in which FIG. 6A is a plan view, FIG. 6B is a bottom view, FIG. 6C is a cross-sectional view taken along the line A-A in FIG. 6A, and FIG. 6D is a cross-sectional view taken along the line B-B in FIG. 6A. In the embodiments described hereinafter, the same constituent elements as the first embodiment will be denoted by the same reference numerals, and description thereof will not be provided unless necessary. A piezoelectric vibrator element 60 according to the second embodiment basically has a similar configuration to that of the first embodiment. However, unlike the first embodiment, the width of a peripheral portion 62 is narrower than the width of the buffering portion 14 in relation to a direction (the X-axis direction) orthogonal to the arrangement direction (the Z'-axis direction) of the mount portion 12, the buffering portion 14, and the peripheral portion 62 (Feature 1). Moreover, the peripheral portion 62 includes a first peripheral portion 62a connected to the buffering portion 14 and a second peripheral portion 62b which is disposed around the vibrating portion 22 and connected to the first peripheral portion 62a. However, unlike the first embodiment, the thickness of the second peripheral portion 62b is thinner than the vibrating portion 22 (Feature 2). In the second embodiment, the excitation electrodes 24A and 24B are disposed on the entire surface of the vibrating portion 22. The vibrating portion 22 has a shape such that it forms the same plane as the second peripheral portion 62b on the positive (+) Y'-axis-side surface, and it protrudes from the second peripheral portion 62b on the negative (−) Y'-axis-side surface.

The step of manufacturing the piezoelectric vibrator element 60 according to the second embodiment is similar to that of the first embodiment, except that the half-etching step includes a step of forming the second peripheral portion 62b that is thinner than the vibrating portion 22 as well as the step of forming the vibrating portion 22.

Moreover, although the width in the X-axis direction of the peripheral portion 62 may be the same as or shorter or longer than the width in the X-axis direction of the mount portion 12, the piezoelectric vibrator element 60 preferably has a shape such that it is bilaterally symmetrical about the line A-A in FIG. 6A as the central line. Moreover, the width in the X-axis direction of the neck portion 20 formed by the notches 18 is identical to the width in the X-axis direction of the first peripheral portion 62a.

With "Feature 1" described above, it is possible to decrease the weight on the free end side of the piezoelectric vibrator element 60 and to improve the stability of mounting. Furthermore, with "Feature 2" described above, it is possible to allow the energy of primary vibration which is thickness-shear vibration to be trapped in the vibrating portion 22 and to improve excitation efficiency of thickness-shear vibration.

Figure 7A:
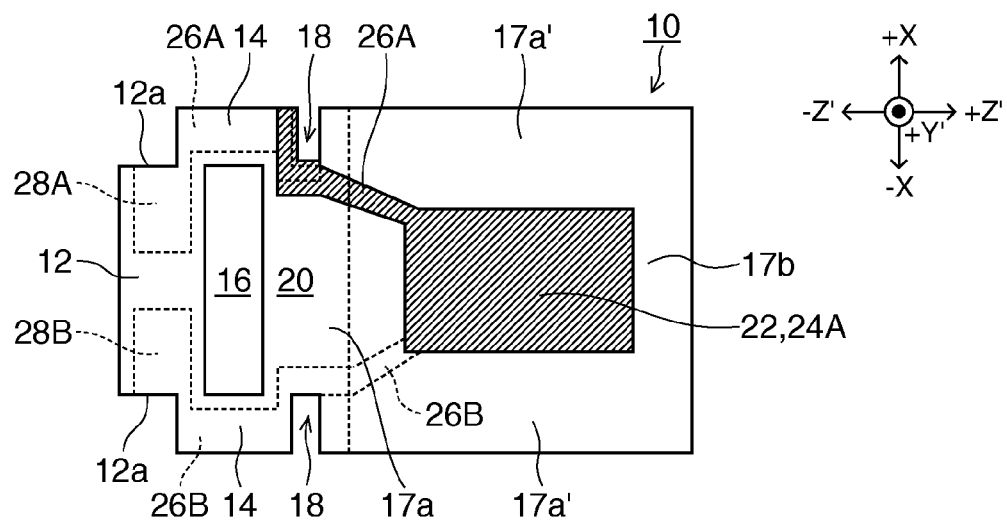
Figure 7B:
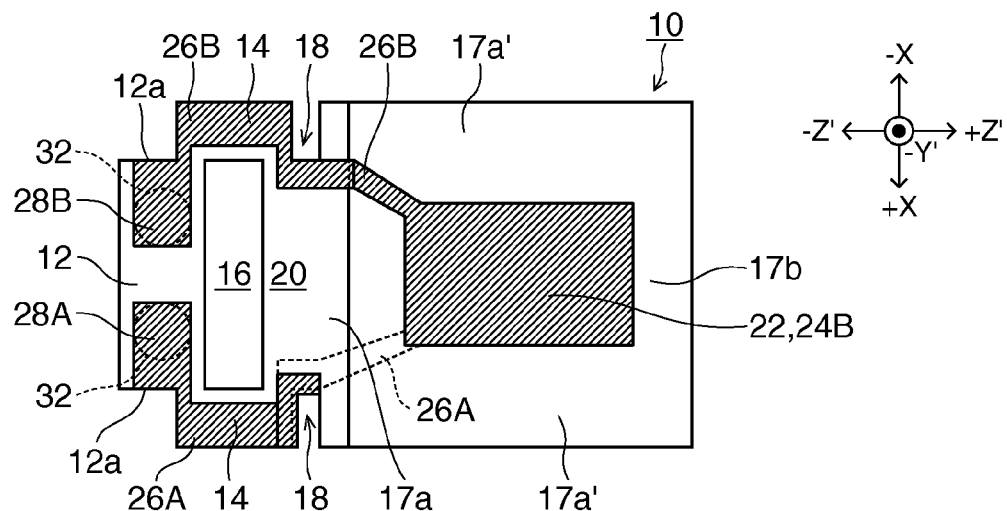
Figure 7C:
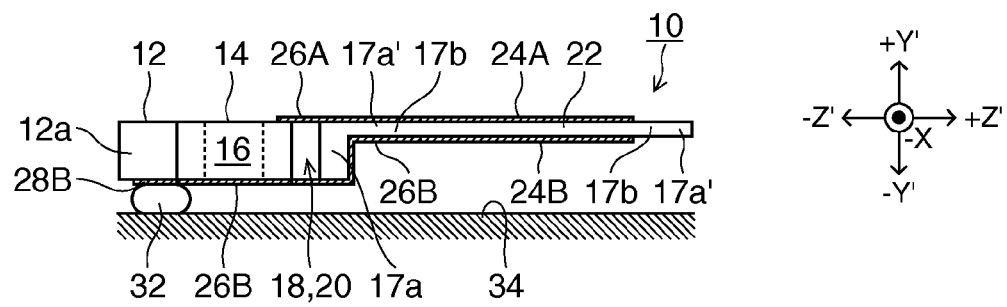
Figure 8A:
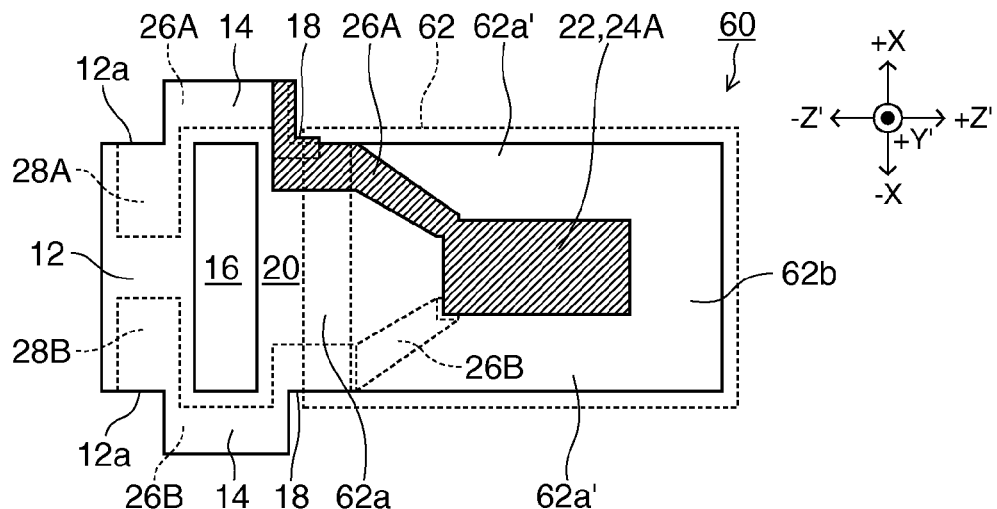
Figure 8B:
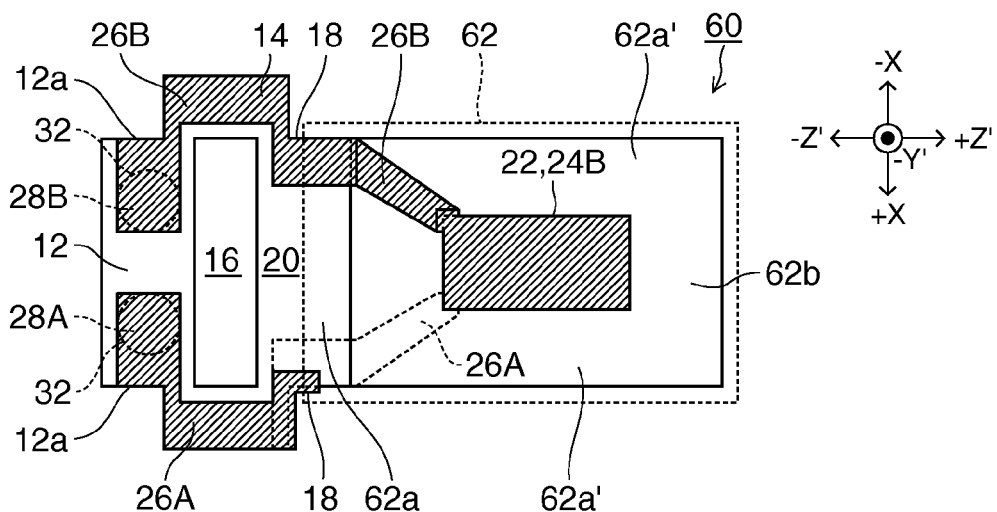
Figure 8C:
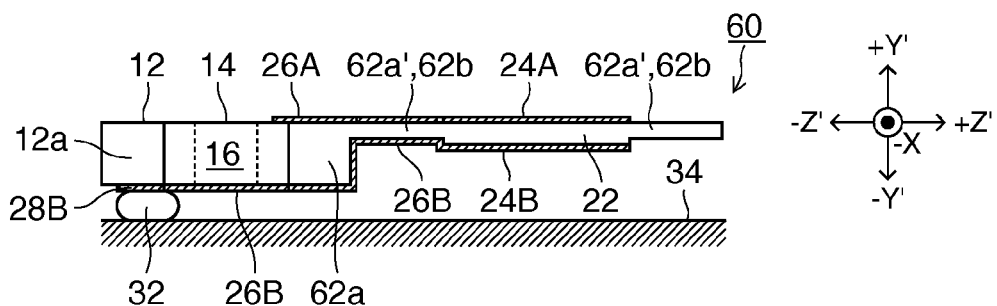

FIGS. 7A to 7C show a modified example of the first embodiment, and FIGS. 8A to 8C show a first modified example of the second embodiment. Here, FIG. 7A is a plan view, FIG. 7B is a bottom view, and FIG. 7C is a side view. Moreover, FIG. 8A is a plan view, FIG. 8B is a bottom view, and FIG. 8C is a side view. As shown in FIGS. 7A to 7C, in the modified example of the first embodiment, a portion (first peripheral portion 17a') of the first peripheral portion 17a connected to the positive/negative (±) X-axis side of the vibrating portion 22 is thinner than the first peripheral portion 17a and is disposed so as to have a principal surface on the same plane as the principal surface of the second vibrating portion 17b (the vibrating portion 22). Moreover, as shown in FIGS. 8A to 8C, in the first modified example of the second embodiment, a portion (first peripheral portion 62a') of the first peripheral portion 62a connected to the positive/negative (±) X-axis side of the vibrating portion 22 is thinner than the first peripheral portion 62a and is disposed so as to have a principal surface on the same plane as the principal surface of the second vibrating portion 62b.

With the above configuration, it is possible to decrease the weight on the free end side of the piezoelectric vibrator element and to improve the stability of mounting. Moreover, the second peripheral portions 17b and 62b form the same plane as the first peripheral portions 17a' and 62a'. Thus, in the modified example of the first embodiment, it is possible to form the vibrating portion 22, the second peripheral portion 17b, and the first peripheral portion 17a' easily by the same process. In the first modified example of the second embodiment, it is possible to form the second peripheral portion 62b and the first peripheral portion 62a' easily by the same process.

Figure 9A:
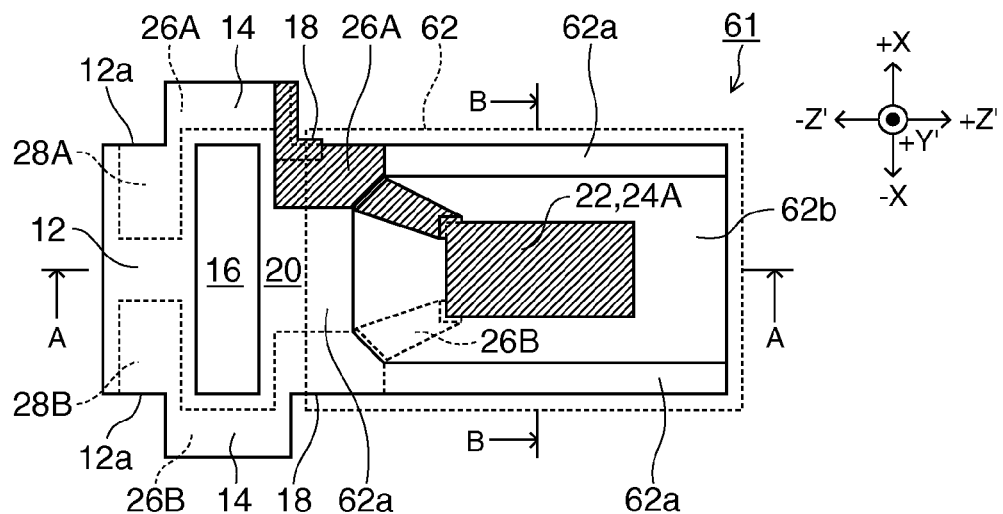
Figure 9B:
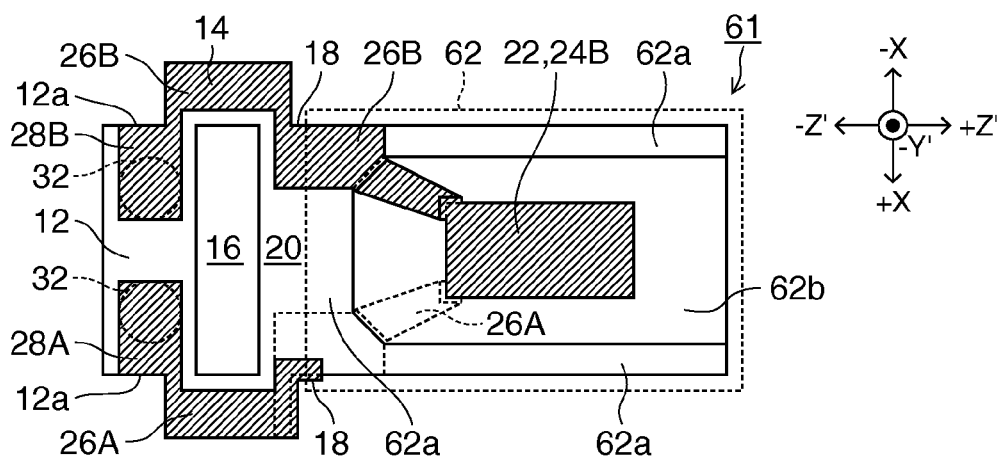
Figure 9C:
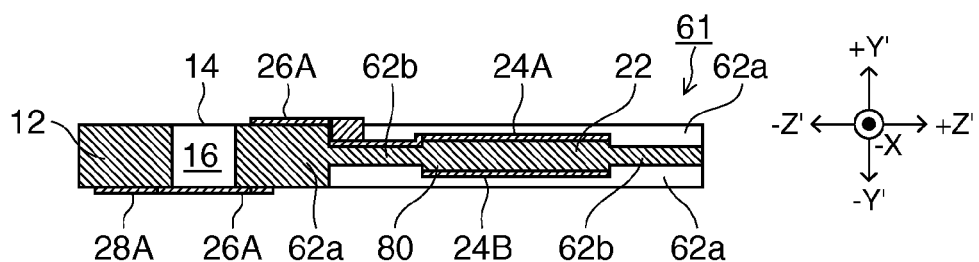
Figure 9D:
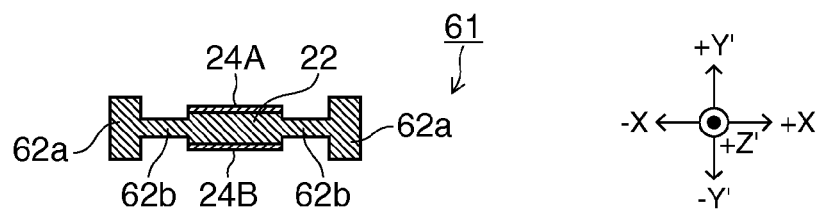

FIGS. 9A to 9D show a second modified example of the piezoelectric vibrator element according to the second embodiment, in which FIG. 9A is a plan view, FIG. 9B is a bottom view, FIG. 9C is a cross-sectional view taken along the line A-A in FIG. 9A, and FIG. 9D is a cross-sectional view taken along the line B-B in FIG. 9A. As shown in FIGS. 9A to 9D, in the second modified example of the second embodiment, the vibrating portion 22 is disposed so as to protrude from both principal surfaces of the second peripheral portion 62b. In this case, the vibrating portion 22 is formed by half-etching a quartz crystal substrate from both principal surfaces thereof so that the shape of the vibrating portion 22 remains. In this way, by disposing the vibrating portion 22 so as to protrude from both principal surfaces of the second peripheral portion 62b, it is possible to obtain a piezoelectric vibrator element 61 in which the effect of trapping the thickness-shear vibration is improved more than the second embodiment. In addition, in the second embodiment, although the rectangular excitation electrodes 24A and 24B are formed on the entire surface of the vibrating portion 22, it is not necessary to dispose the same so as to cover the entire surface of the vibrating portion 22. Furthermore, the excitation electrodes 24A and 24B may have a circular or elliptical shape, for example, so as to correspond to the actual vibration region of the vibrating portion 22 where the thickness-shear vibration occurs. By doing so, it is possible to allow the energy of the primary vibration which is the thickness-shear vibration to be trapped in the vibrating portion 22.

Figure 10A:
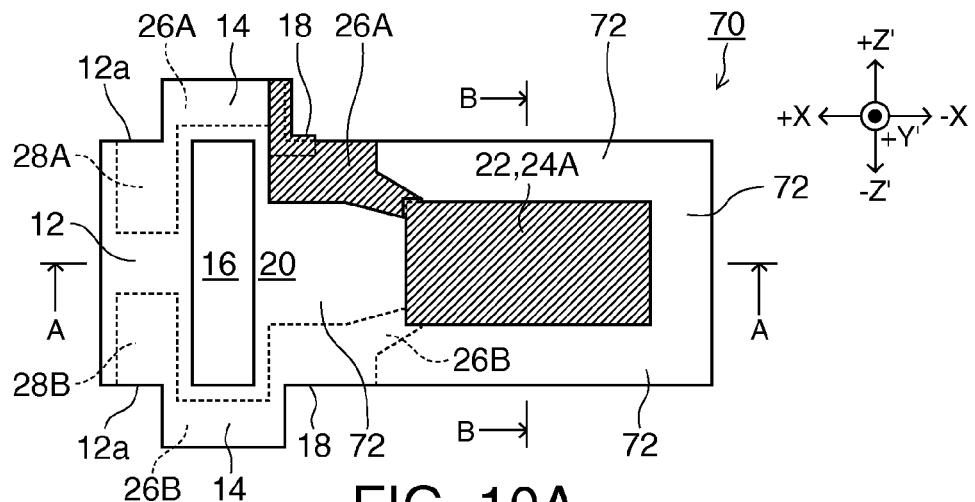
Figure 10B:
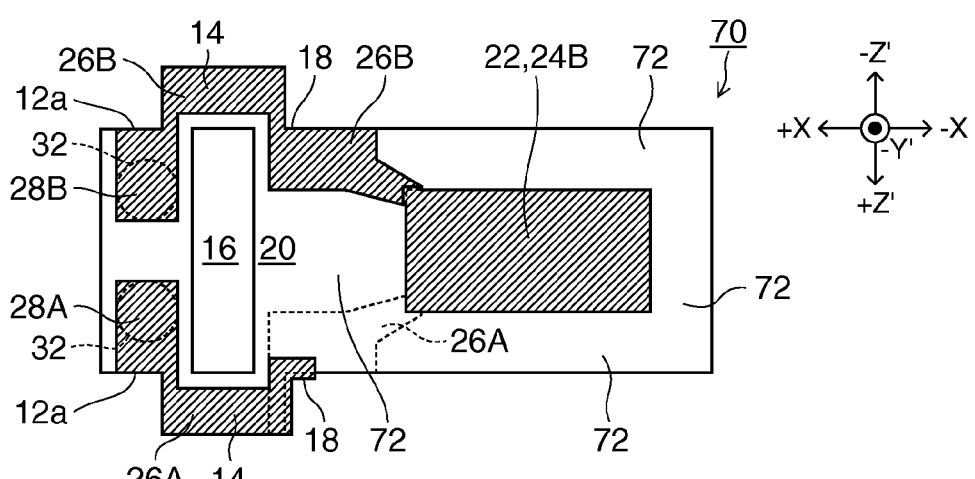
Figure 10C:
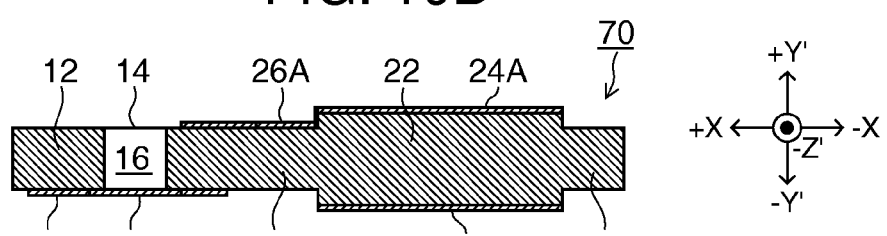
Figure 10D:
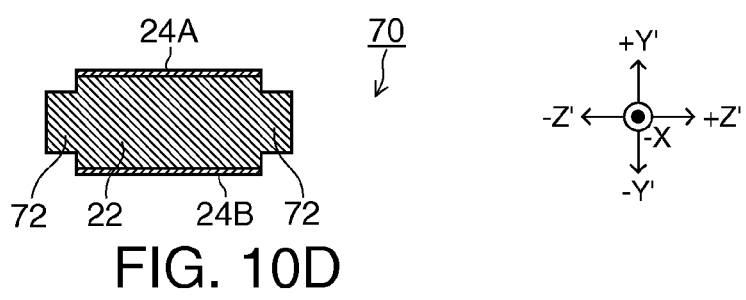
Figure 11:
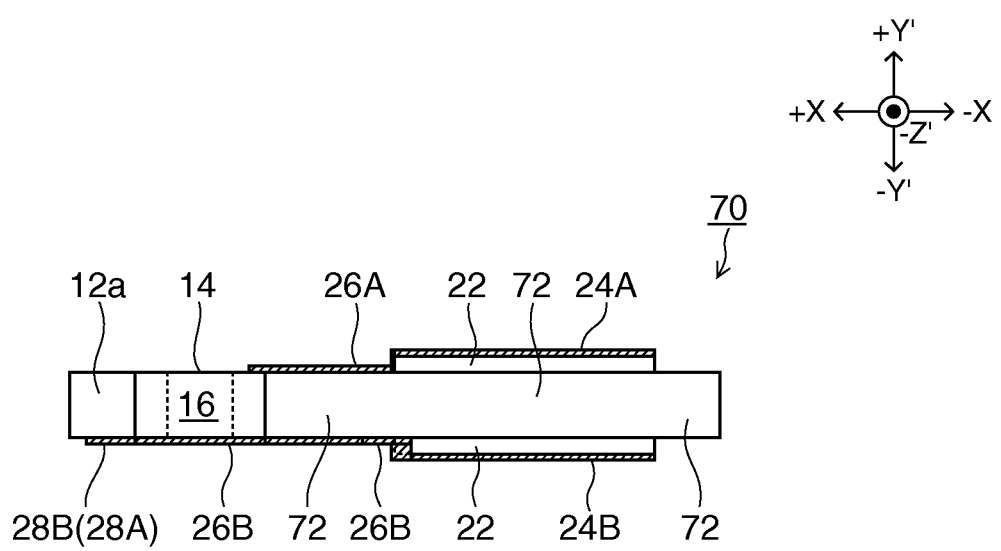
FIG. 11 is a side view of the piezoelectric vibrator element according to the third embodiment.

FIGS. 10A to 10D are schematic views of a piezoelectric vibrator element according to the third embodiment, in which FIG. 10A is a plan view, FIG. 10B is a bottom view, FIG. 10C is a cross-sectional view taken along the line A-A in FIG. 10A, and FIG. 10D is a cross-sectional view taken along the line B-B in FIG. 10A. Moreover, FIG. 11 shows the side view of the piezoelectric vibrator element according to the third embodiment. A piezoelectric vibrator element 70 according to the third embodiment basically has a similar configuration to that of the first and second embodiments. However, the piezoelectric vibrator element 70 is disposed so that the short-side direction thereof is the Z'-axis direction, and the long-side direction thereof is the X-axis direction. Moreover, unlike the first and second embodiments, the vibrating portion 22 is disposed so as to be thicker than the first peripheral portion 72. Furthermore, the vibrating portion 22 is disposed so that the principal surfaces thereof protrude from both principal surfaces of the first peripheral portion 62. With the above configuration, it is possible to confine the vibration region of the thickness-shear vibration to the vibrating portion 22 and to improve the excitation efficiency. Moreover, it is possible to alleviate the stress propagating from the mount portion 12 to the vibrating portion 22 as will be described later. Furthermore, in the present embodiment, the propagation process of the stress occurring in the mount portion 12 and the stress alleviating process are the same as those of the first embodiment and the like up to the processes occurring between the mount portion 12 and the neck portion 20. Moreover, in the present embodiment, the piezoelectric vibrator element 70 has a mesa structure in which the vibrating portion 22 is thicker than the first peripheral portion 72. Thus, a step is formed at the boundary between the vibrating portion 22 and the first peripheral portion 72. As a result, the stress which has occurred in the mount portion 12 and reached the boundary between the first peripheral portion 72 and the vibrating portion 22 is alleviated by the step. Accordingly, it is possible to alleviate the stress propagating to the vibrating portion 22.

In addition, the step of manufacturing the piezoelectric vibrator element according to the third embodiment may be performed as follows. First, a quartz crystal substrate having the same thickness as the vibrating portion 22 is prepared. Subsequently, both surfaces of the quartz crystal substrate are half-etched so that the portion later serving as the vibrating portion 22 remains until the quartz crystal substrate has the same thickness as the mount portion 12, the buffering portion 14, and the peripheral portion 62. Then, etching is performed so as to penetrate through the outer shape of the piezoelectric vibrator element 70 so that the portion later serving as the mount portion 12, the buffering portion 14 (the slit 16), and the first peripheral portion 72 remain. The subsequent electrode forming step is the same as that of the first embodiment.

Figure 12A:
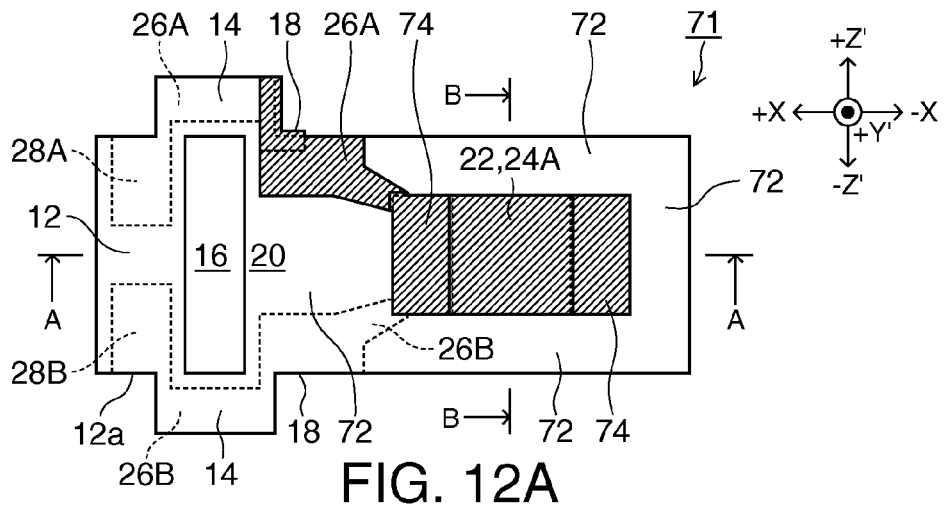
Figure 12B:
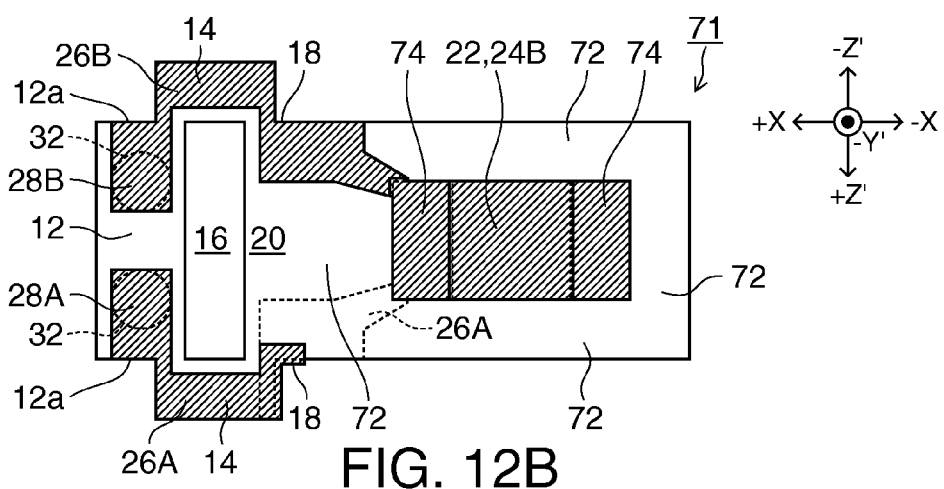
Figure 12C:
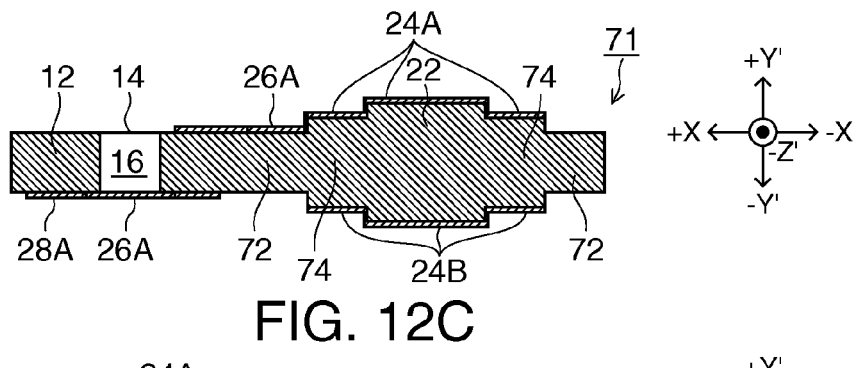
Figure 12D:
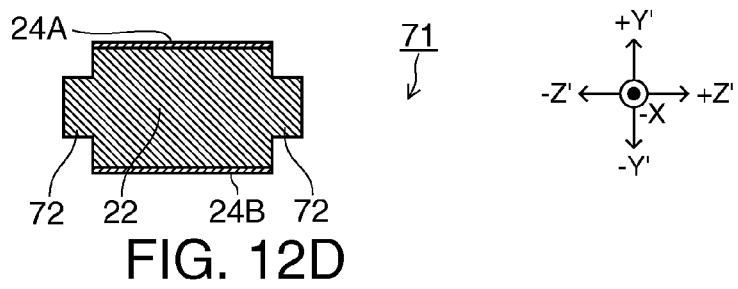
Figure 13:
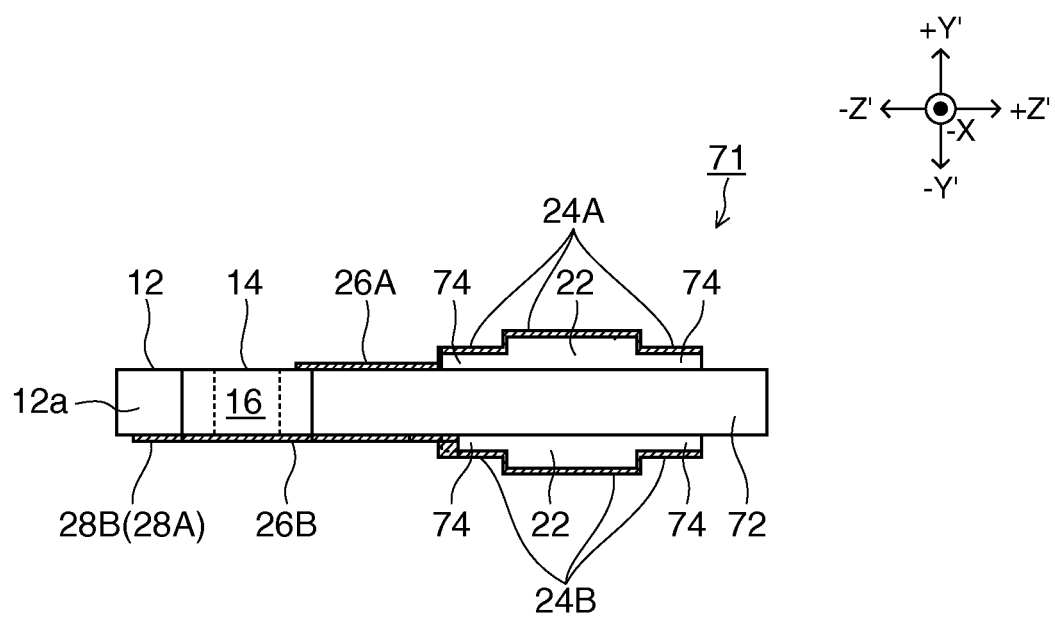
FIG. 13 is a side view of the piezoelectric vibrator element according to the fourth embodiment.

FIGS. 12A to 12D are schematic views of a piezoelectric vibrator element according to the fourth embodiment, in which FIG. 12A is a plan view, FIG. 12B is a bottom view, FIG. 12C is a cross-sectional view taken along the line A-A in FIG. 12A, and FIG. 12D is a cross-sectional view taken along the line B-B in FIG. 12A. Moreover, FIG. 13 shows the side view of the piezoelectric vibrator element according to the fourth embodiment. A piezoelectric vibrator element 71 according to the fourth embodiment has a similar configuration to that of the third embodiment. However, unlike the third embodiment, the piezoelectric vibrator element 71 has a second peripheral portion 74 which is disposed around the vibrating portion 22 and connected to a first peripheral portion 72, and the second peripheral portion 74 is thicker than the first peripheral portion 72. Here, the second peripheral portion 74 is disposed so that both principal surfaces thereof protrude from both principal surfaces of the first peripheral portion 72, and the vibrating portion 22 is disposed so that both principal surfaces thereof protrude from both principal surfaces of the second peripheral portion 74. Moreover, the excitation electrodes 24A and 24B are disposed so as to cover the principal surfaces of the vibrating portion 22 and the principal surfaces of the second peripheral portion 74. With the above configuration, since the piezoelectric vibrator element 71 has a two-step mesa structure around the vibrating portion 22, it is possible to allow the thickness-shear vibration to be efficiently trapped in the vibrating portion 22 and to improve the excitation efficiency. In particular, in the present embodiment, since the excitation electrodes 24A and 24B are disposed so as to cover the second peripheral portion 74 as well as the vibrating portion 22, it is possible to improve the excitation efficiency in the vibrating portion 22 and to improve the CI value. Furthermore, in the present embodiment, since a so-called two-step mesa structure is realized, the number of steps in the thickness direction of the piezoelectric vibrator element 71 is increased more than in the third embodiment. Thus, it is possible to alleviate the stress propagating from the mount portion 12 to the vibrating portion 22 even more than in the third embodiment.

In addition, the step of manufacturing the piezoelectric vibrator element 71 according to the fourth embodiment may be performed as follows. First, a quartz crystal substrate having the same thickness as the vibrating portion 22 is prepared. Subsequently, both surfaces of the quartz crystal substrate are half-etched so that the portion later serving as the vibrating portion 22 remains until the quartz crystal substrate has the same thickness as the second peripheral portion 74. Then, half-etching is further performed so that the portion later serving as the vibrating portion 22 and the second peripheral portion 74 remains until the quartz crystal substrate has the same thickness as the mount portion 12, the buffering portion 14, and the first peripheral portion 72. Subsequently, etching is performed so as to penetrate through the outer shape of the piezoelectric vibrator element 71 so that the portion later serving as the mount portion 12, the buffering portion 14 (the slit 16), and the first peripheral portion 72 remain. The subsequent electrode forming step is the same as that of the first embodiment.

Figure 14:
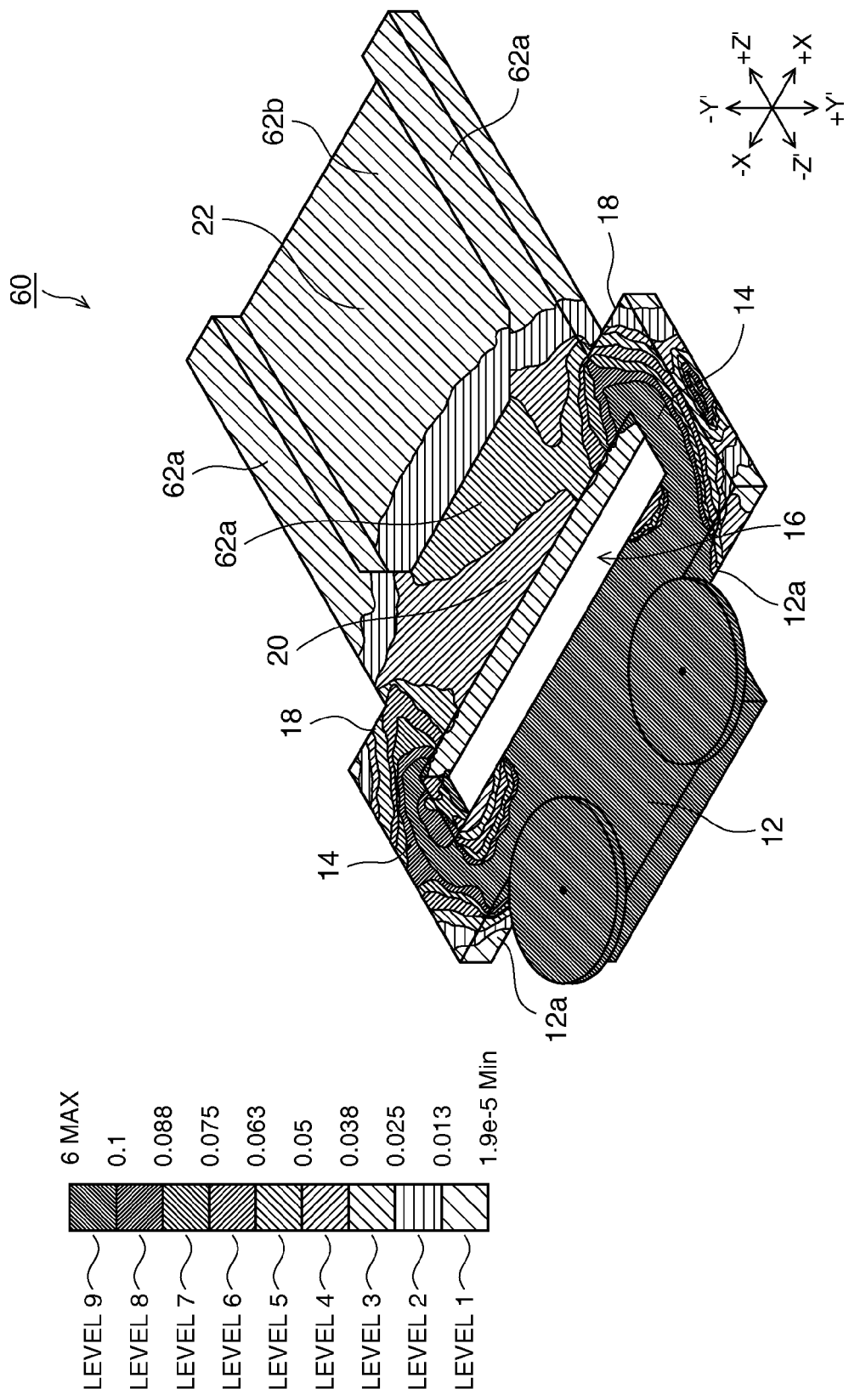
FIG. 14 is a view showing an intensity distribution of stress when stress is applied to a mount portion of the piezoelectric vibrator element according to the present embodiment.

FIG. 14 shows an intensity distribution of stress when stress (thermal strain) is applied to a mount portion of the piezoelectric vibrator element according to the present embodiment. The present inventors performed simulation of the intensity distribution of stress when stress is applied to a mount portion of the piezoelectric vibrator element according to the present embodiment. The piezoelectric vibrator element subjected to the simulation has substantially the same shape as the piezoelectric vibrator element of the second embodiment shown in FIGS. 6A to 6D, except that no step is formed between the vibrating portion 22 and the second peripheral portion 62b. Thus, in the description of the present simulation, the constituent elements of the piezoelectric vibrator element 60 shown in FIGS. 6A to 6D will be referenced.

As shown in FIG. 14, the distribution of stress propagating along the surface of the piezoelectric vibrator element 60 was simulated when an attractive or repulsive force was applied between two points at the two central positions of the two circles depicted on the mounting surface of the mount portion 12. In addition, the patterns arranged in a vertical line to the left of FIG. 14 represent the intensity (Levels 1 to 9) of stress received by the piezoelectric vibrator element 60 due to the stress occurring in the mount portion 12. Here, Level 9 represents a region which receives the largest stress, and the intensity of the received stress decreases from the region of Level 9 to the region of Level 1. Moreover, Level 1 represents a region which receives the smallest stress or in which the intensity of the received stress is equal to or lower than a detection limit of stress. Moreover, these patterns are depicted on the piezoelectric vibrator element 60 so as to correspond to the intensity distribution of stress on the piezoelectric vibrator element 60.

As shown in FIG. 14, it can be understood that strong stress (Level 9) occurs in the entire mount portion 12 and on the mount portion 12 side of the buffering portion 14. Moreover, the stress (Level 9) occurring on the mount portion 12 side is alleviated to about Level 4 or 5 on the first peripheral portion 62a side of the slit 16. This is considered to be attributable to the fact that the stress propagating to the positions of the buffering portion 14 around the slit 16 is alleviated by a large proportion in the course of the propagation. Furthermore, the path of propagation in a straight line to the vibrating portion 22, of the stress having propagated to the positions of the buffering portion 14 corresponding to both ends in the long-side direction of the slit 16 is blocked by the notches 18, so that the propagation path of the stress is bent so as to extend to the center of the neck portion 20. As a result, the stress is also alleviated by a large proportion in the course of the propagation along the propagation path.

Moreover, at the boundary between the first peripheral portion 62a and the negative (−) Z'-axis side of the second peripheral portion 62b, although the stress on the first peripheral portion 62a side is dominantly at Level 5, the stress on the second peripheral portion 62b side is dominantly at Level 2. As above, the intensity of stress shows a discontinuous change at this boundary. This is attributable to the following fact. Since the second peripheral portion 62b is thinner than the first peripheral portion 62a, only a part of the stress having propagated through the inside of the first peripheral portion 62a is received by the second peripheral portion 62b. Moreover, since a step is formed between the second peripheral portion 62b and the first peripheral portion 62a, the propagation path of the stress is bent in the thickness direction of the piezoelectric vibrator element 60 by this step, and the stress propagating along the surface of the piezoelectric vibrator element 60 is alleviated by the bent path. Furthermore, the second peripheral portion 62b (the vibrating portion 22) is formed in a manner of being recessed from the surface of the mount portion 12 where the conductive adhesive agent 32 is applied. In addition, since the stress is also alleviated in the thickness direction of the piezoelectric vibrator element 60, the second peripheral portion 62b receives only a part of the stress which has been alleviated in the thickness direction of the first peripheral portion 62a. Thus, it can be said that the stress can hardly propagate from the neck portion 20 to the portions of the first peripheral portion 62a connected to the second peripheral portion 62b from the positive/negative (±)

X-axis sides, and the stress can hardly propagate from the above portions to the second peripheral portion 62b.

Furthermore, the level of stress decreases as it advances in the positive (+) Z'-axis direction further away from the boundary between the second peripheral portion 62b and the first peripheral portion 62a, and the stress is dominantly at Level 1 at the central portion of the second peripheral portion 62b where the vibrating portion 22 is disposed. In the piezoelectric vibrator element 60 of the present embodiment, it is considered that since the vibrating portion 22 (the excitation electrodes 24A and 24B) is disposed at the central position of the second peripheral portion 62b, the vibrating portion 22 is barely affected by the stress, and favorable frequency properties can be obtained. Furthermore, in the second embodiment, since a step is formed in the thickness direction between the second peripheral portion 62b and the vibrating portion 22, the stress propagating to the vibrating portion 22 is further alleviated by the step.

The above simulation was performed for a case where the vibrating portion 22 is thinner than the peripheral portion 62 (the first peripheral portion 62a). However, even when the vibrating portion 22 is thicker than the first peripheral portion 72 as in the case of the third embodiment shown in FIGS. 10A to 10D, since a step is formed between the vibrating portion 22 and the first peripheral portion 72, the stress propagating to the vibrating portion 22 is alleviated by the step. Furthermore, by realizing a two-step mesa structure as in the case of the fourth embodiment shown in FIG. 11, it is possible to alleviate the stress propagating to the vibrating portion even more since the number of steps increases.

The piezoelectric vibrator element of the first and second embodiments has been configured as an inverted mesa-type piezoelectric vibrator element in which the short-side direction thereof is the X-axis direction, and the long-side direction thereof is the Z'-axis direction. Moreover, the piezoelectric vibrator element of the third and fourth embodiments has been configured as a mesa-type piezoelectric vibrator element in which the short-side direction thereof is the Z'-axis direction, and the long-side direction thereof is the X-axis direction. However, the invention is not limited to this, the inverted mesa-type piezoelectric vibrator element may be configured so that the short-side direction thereof is the Z'-axis direction, and the long-side direction thereof is the X-axis direction, and the mesa-type piezoelectric vibrator element may be configured so that the short-side direction thereof is the X-axis direction, and the long-side direction thereof is the Z'-axis direction.

Figure 15A:
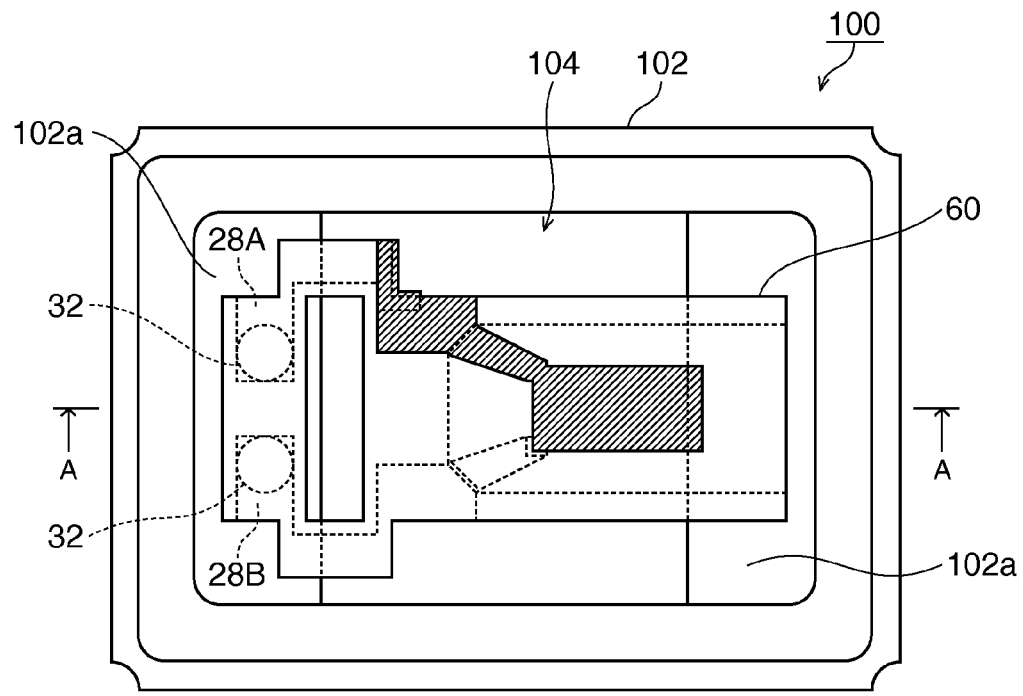
Figure 15B:
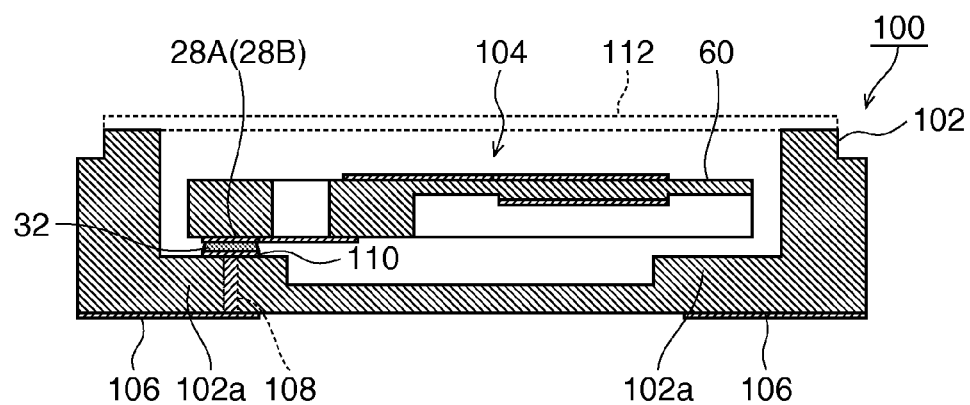

FIGS. 15A and 15B show a piezoelectric vibrator on which the piezoelectric vibrator element according to the present embodiment is mounted. FIG. 15A is a plan view of a piezoelectric vibrator 100 when the piezoelectric vibrator element 60 shown in FIGS. 6A to 6D is mounted thereon, and FIG. 15B is a cross-sectional view taken along the line A-A in FIG. 15A. The piezoelectric vibrator 100 includes a package 102 having a recess portion 104 in which the piezoelectric vibrator element 60 is accommodated, and a lid 112 that seals the recess portion 104. Moreover, an external electrode 106 is formed on the lower surface in the bottom portion (amounting substrate 102a) of the package 102, and a connection electrode 110 electrically connected to the external electrode 106 through a penetration electrode 108 is disposed on the upper surface of the mounting substrate 102a. Moreover, the connection electrode 110 is bonded to the pad electrodes 28A and 28B of the mount portion 12 by the conductive adhesive agent 32. Thus, the piezoelectric vibrator element 60 is connected to the package 102 in a cantilevered state with the mount portion 12 as a fixed end. With the above configuration, the piezoelectric vibrator 100 in which the stress to the vibrating portion 22 of the piezoelectric vibrator element 60 is alleviated is realized. Furthermore, with the above configuration, by bonding the pad electrodes 28A and 28B (the extraction electrodes 26A and 26B) and the connection electrode 110 with the conductive adhesive agent 32 and connecting the pad electrodes 28A and 28B and the connection electrode 110 mechanically and electrically, it is possible to realize a so-called face-down bonding-type mounting state. Thus, it is possible to realize a low profile of the piezoelectric vibrator 100 having a module structure including the piezoelectric vibrator element 60 and the mounting substrate 102a.

Figure 16:
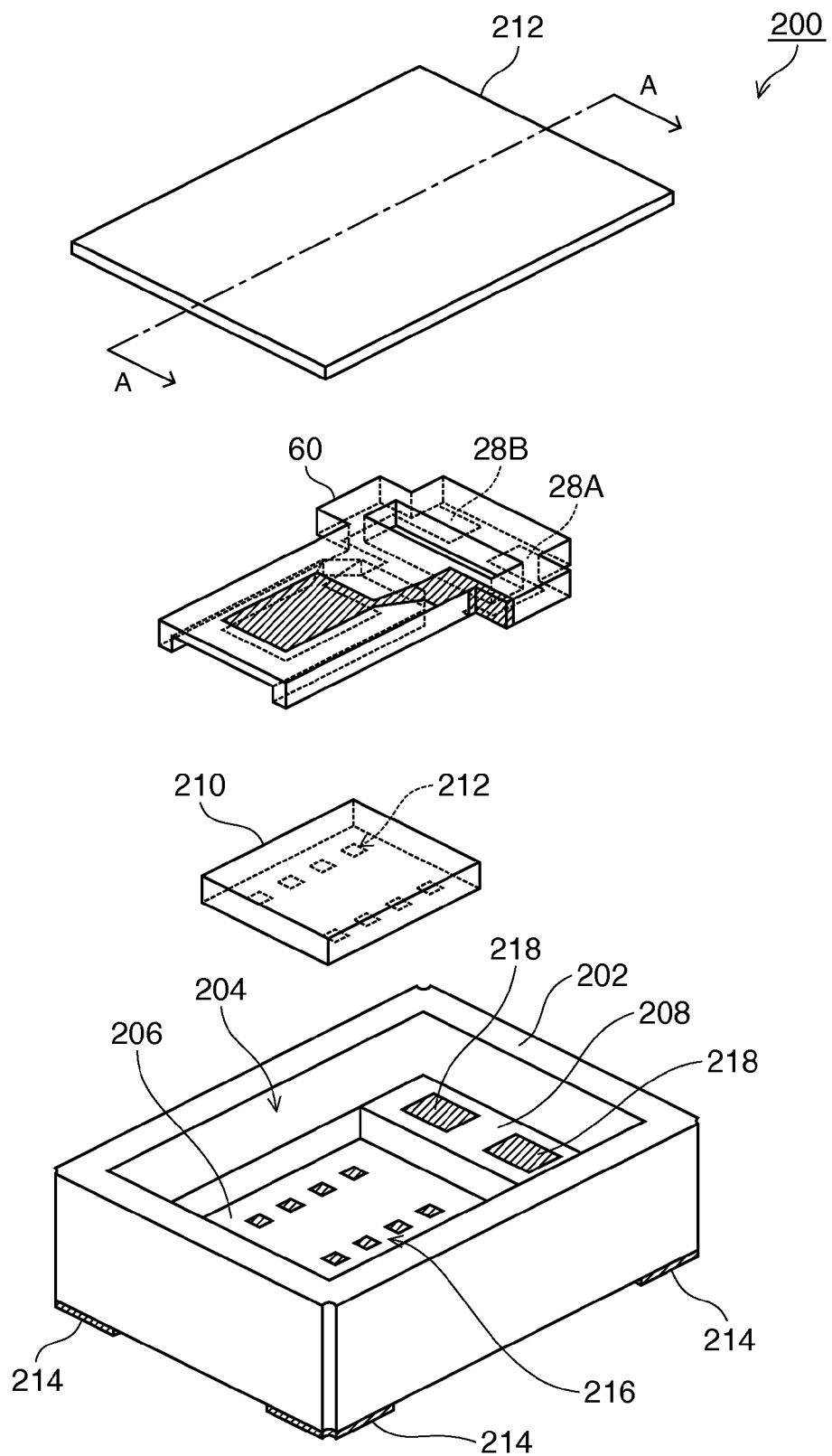
FIG. 16 is an exploded perspective view of a piezoelectric module when the piezoelectric vibrator element shown in FIGS. 6A to 6D is mounted thereon.
Figure 17A:
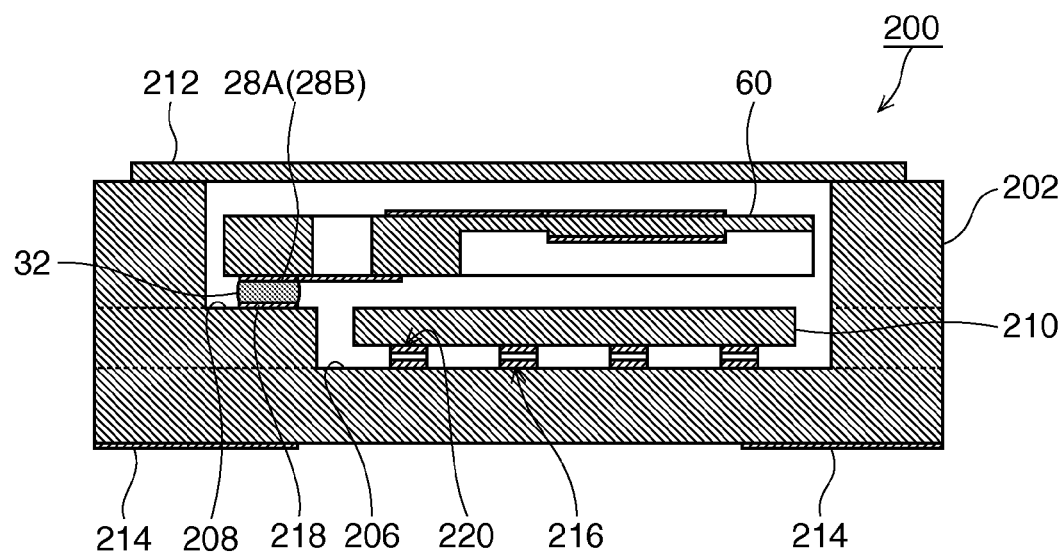
Figure 17B:
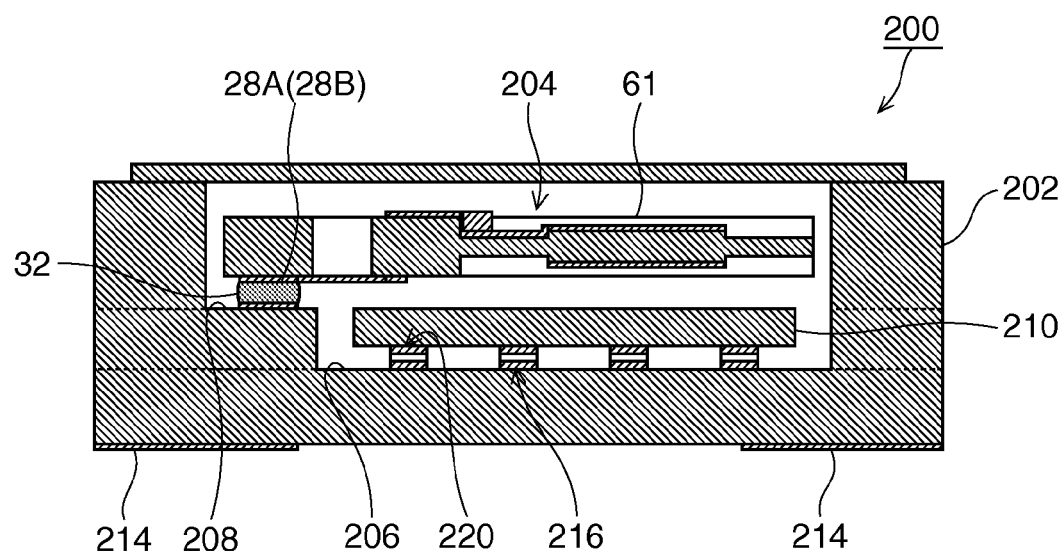

FIG. 16 and FIGS. 17A and 17B show a piezoelectric module on which the piezoelectric vibrator element according to the present embodiment is mounted. FIG. 16 shows an exploded perspective view of the piezoelectric module when the piezoelectric vibrator element 60 shown in FIGS. 6A to 6D is mounted thereon. Moreover, FIG. 17A is a cross-sectional view taken along the line A-A in FIG. 16, and FIG. 17B is a cross-sectional view taken along the line A-A in FIG. 16 when the piezoelectric vibrator element 61 shown in FIGS. 9A to 9D is mounted thereon. A piezoelectric module 200 according to the present embodiment includes a package 202 (a mounting substrate), the piezoelectric vibrator elements 60 and 61, an integrated circuit (IC 210) that drives the piezoelectric vibrator elements 60 and 61 (see FIGS. 9A to 9D), and a lid 212. The package 202 has a three-layer structure as indicated by the broken line in FIGS. 17A and 17B. An external electrode 214 is formed on the lower surface of the package 202. Moreover, a plurality of connection electrodes 216 is disposed on a lower end portion 206 of a recess portion 204 of the package 202. Furthermore, a connection electrode 218 that is electrically connected to pad electrodes 220 of the IC 210 and is connected to the pad electrodes 28A and 28B (see FIGS. 6A to 6D, 7A to 7C, and 17A and 17B) of the piezoelectric vibrator elements 60 and 61 by the conductive adhesive agent 32 is formed on an upper end portion 208 of the recess portion 204 of the package 202. The plurality of connection electrodes 216 is disposed so as to correspond to the pad electrodes 220 of the IC 210 and is electrically connected to the pad electrodes 220 by a conductive adhesive agent. However, a part of the connection electrode 216 is electrically connected to the connection electrode 218 and the external electrode 214. The piezoelectric module 200 of the present embodiment has a structure in which both the piezoelectric vibrator elements 60 and 61 and the IC 210 are sealed in the recess portion 204 by the lid 212. With the above configuration, the piezoelectric module 200 in which the stress to the vibrating portion of the piezoelectric vibrator element is alleviated is realized.

Figure 18:
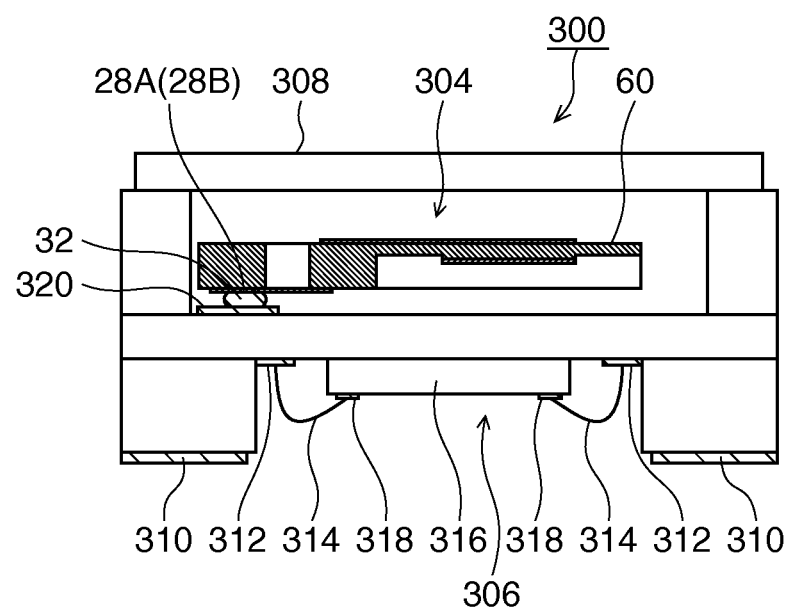
FIG. 18 is a view showing a first modified example of the piezoelectric module according to the present embodiment.

FIG. 18 shows the first modified example of the piezoelectric module according to the present embodiment. In FIG. 18, a piezoelectric module 300 has a configuration in which recess portions 304 and 306 are formed on both surfaces of a package 302 (a mounting substrate), the piezoelectric vibrator element 60 is mounted in one recess portion 304 and sealed by a lid 308, and an integrated circuit (an IC 316) is attached to the other recess portion 306. Moreover, an external electrode 310 is formed at the lower end of the package 302, and a connection electrode 312 which is electrically connected to the external electrode 310 or the connection electrode 320 disposed in the recess portion 304 and is electrically connected to the pad electrode 318 of the IC 316 through a wire 314 is disposed in the recess portion 306. On the other hand, the connection electrode 320 disposed in the recess portion 304 is connected to the pad electrodes 28A and 28B of the piezoelectric vibrator element 60 by the conductive adhesive agent 32. Thus, the piezoelectric vibrator element 60 is connected to the package 302 in a cantilevered state with the mount portion 12 as a fixed end. By isolating the piezoelectric vibrator element 60 from the IC 316 in this way, it is possible to decrease the effect of heat from the IC 316 to the piezoelectric vibrator element 60.

Figure 19A:
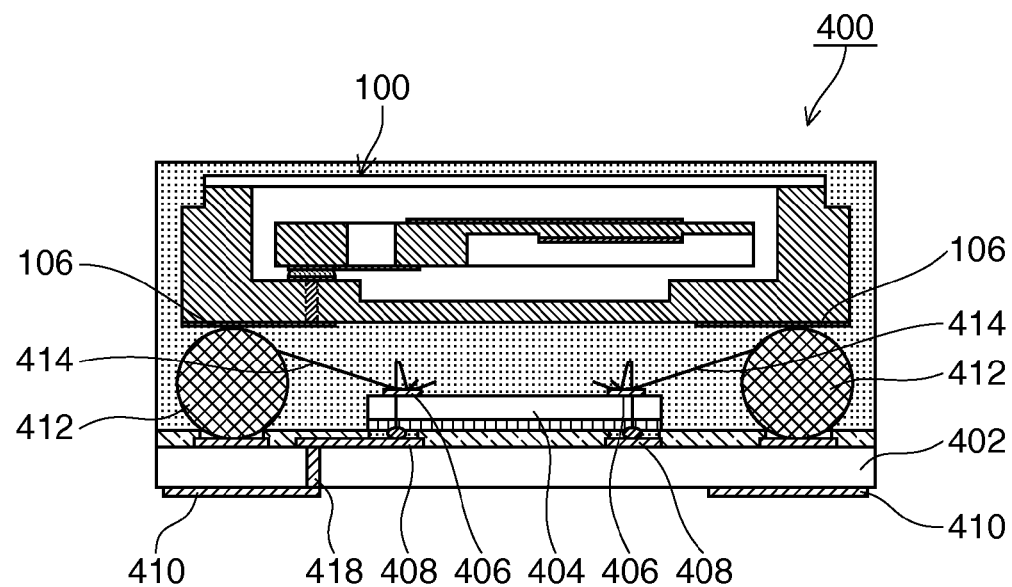
Figure 19B:
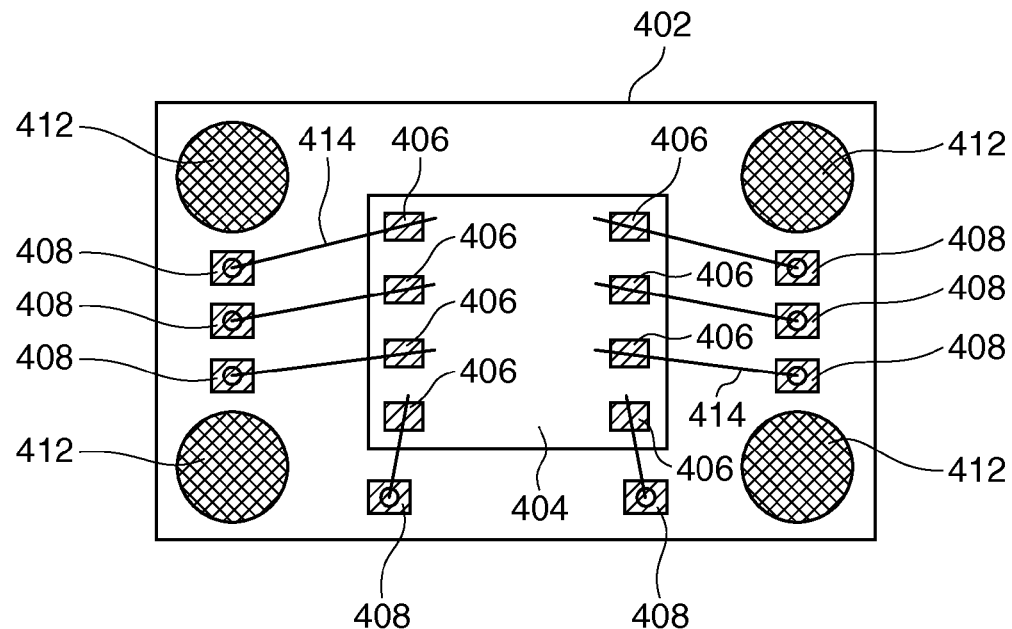

FIGS. 19A and 19B show the second modified example of the piezoelectric module according to the present embodiment. FIG. 19A is a side view, and FIG. 19B is a plan view of a substrate that constitutes the piezoelectric module. In the second modified example, a piezoelectric module 400 is formed using the piezoelectric vibrator 100 shown in FIG. 11, for example. That is, in the second modified example, electrode balls 412 electrically connected to an IC 404 (pad electrodes 406) are disposed on a substrate 402 on which an integrated circuit (the IC 404) for driving the piezoelectric vibrator 100 is mounted, so that the electrode balls 412 support the piezoelectric vibrator 100, and the electrode balls 412 are electrically connected to the external electrodes 106 of the piezoelectric vibrator 100. Furthermore, the substrate 402, the IC 404, the electrode balls 412, and the piezoelectric vibrator 100 are integrated with each other by a molding agent 416 such as a resin. Here, the external electrodes 410 are formed on the lower surface of the substrate 402, and the connection electrodes 408 electrically connected to the external electrodes 410 through penetration electrodes 418 are formed on the upper surface of the substrate 402. Moreover, part of the pad electrodes 406 formed on the IC 404 is connected to the electrode balls 412 through wires 414, and the remaining part thereof is connected to the connection electrodes 408 through the wires 414.

With the above configuration, it is possible to dispose the substrate 402, the IC 404, the electrode balls 412, and the like so as to correspond to the specifications of the existing piezoelectric vibrator 100 and to form the piezoelectric module 400. Thus, it is possible to suppress an increase in the cost. In any of the above embodiments, the connection between the IC and the respective electrodes may be realized by face-down bonding. Moreover, the present modified example can be applied to any of the above embodiments of the piezoelectric vibrator element, the piezoelectric vibrator, and the piezoelectric module.

Figure 20A:
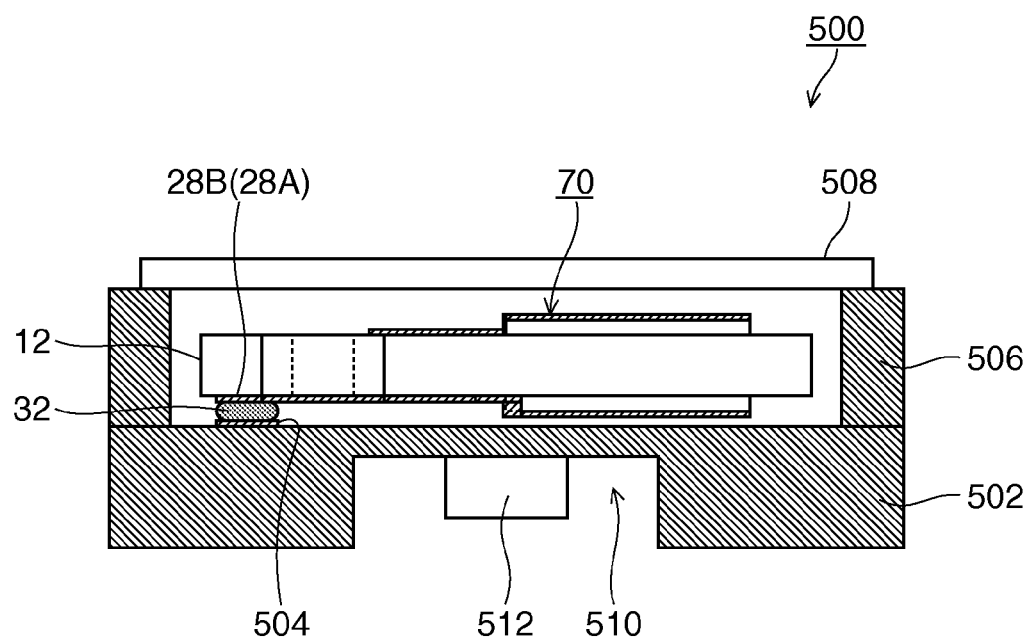
Figure 20B:
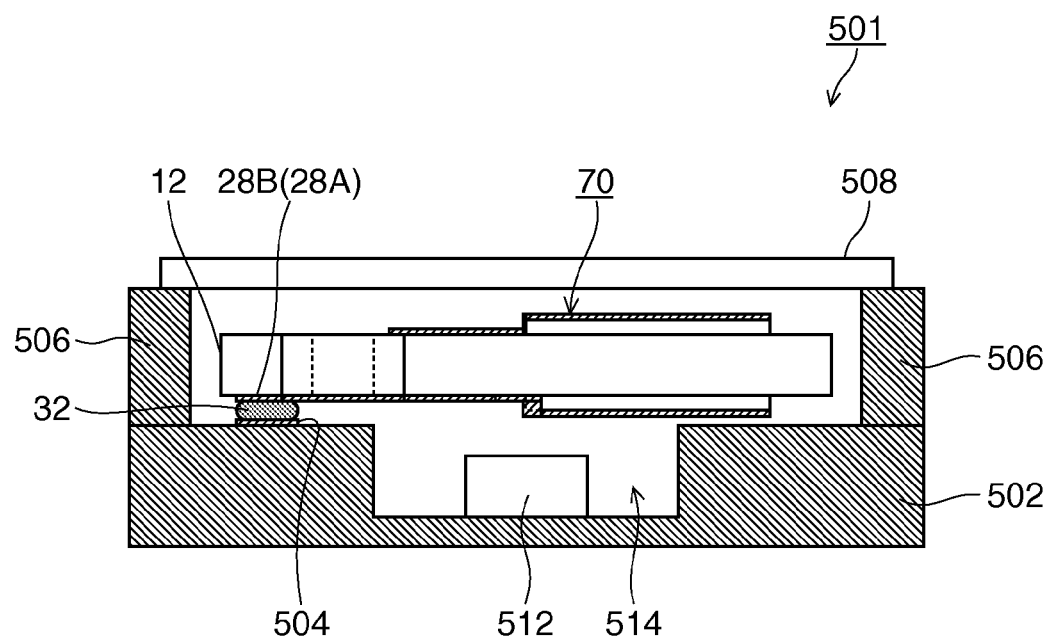
Figure 21A:
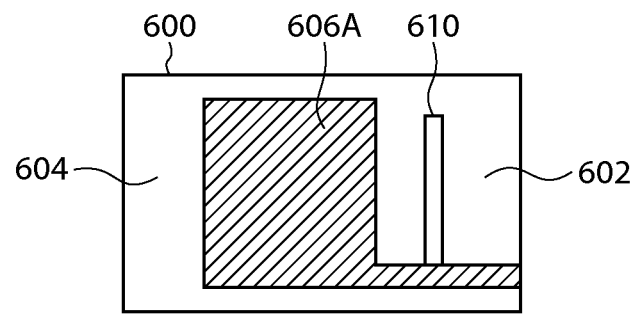
Figure 21B:
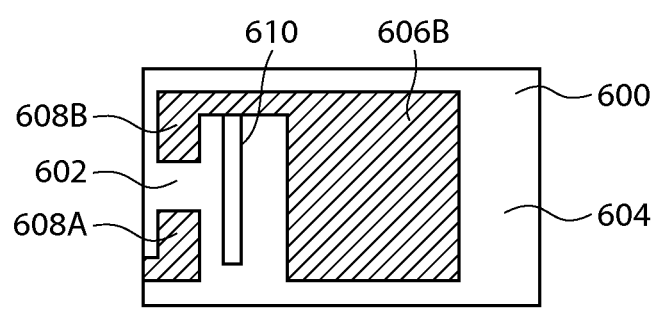
Figure 21C:
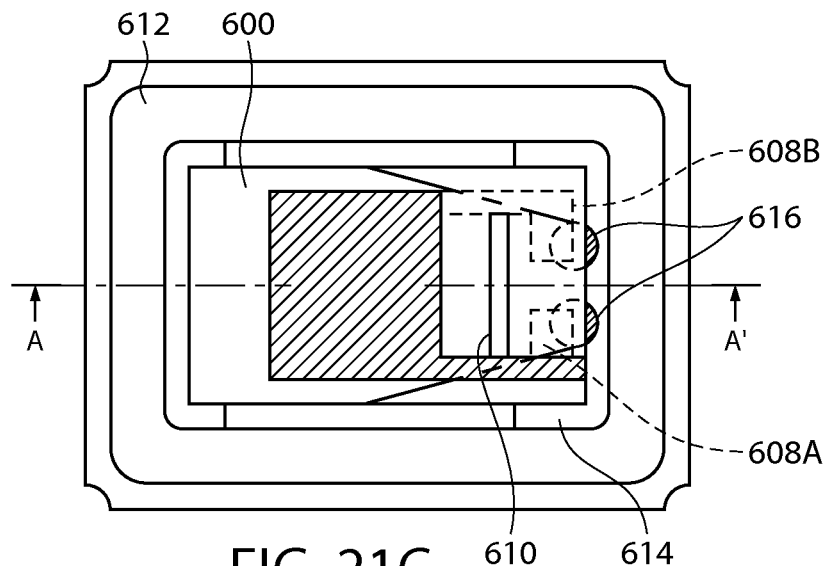
Figure 21D:
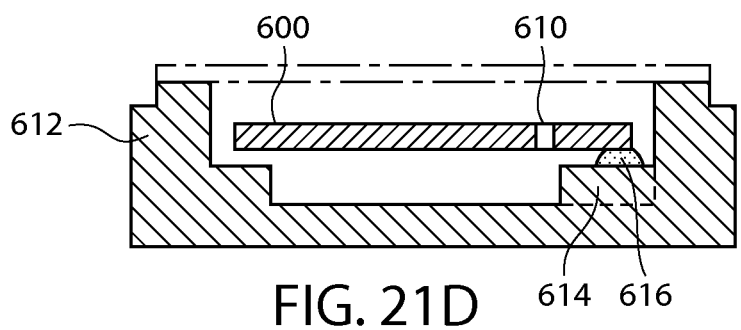
Figure 22A:
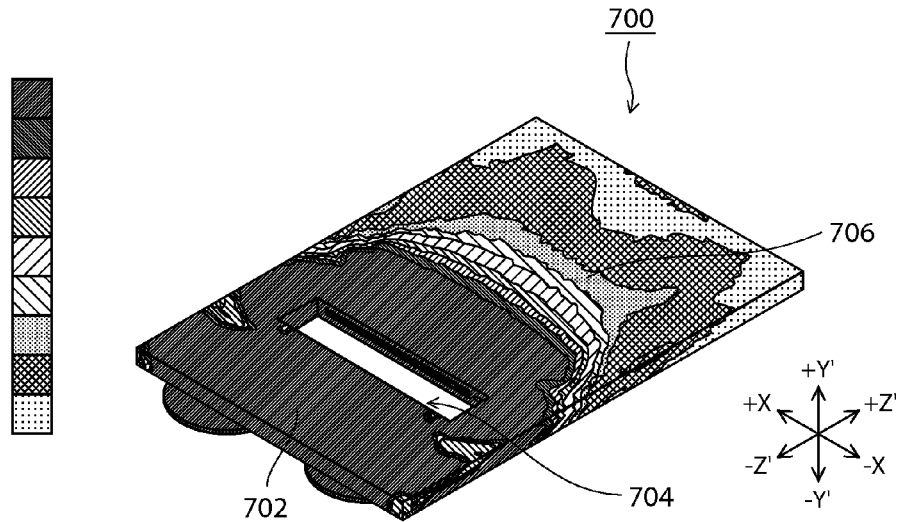
Figure 22B:
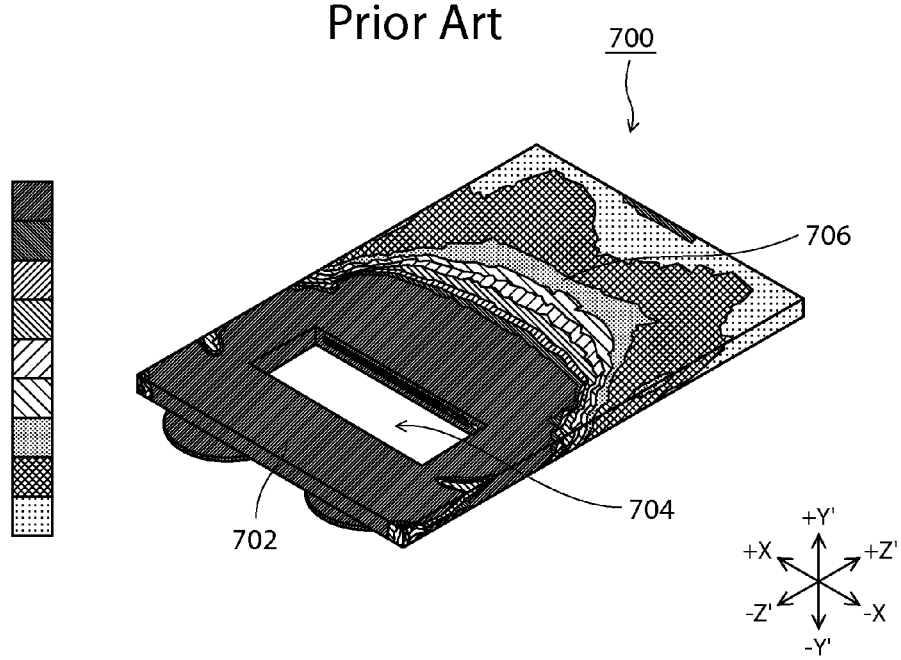
Figure 23A:
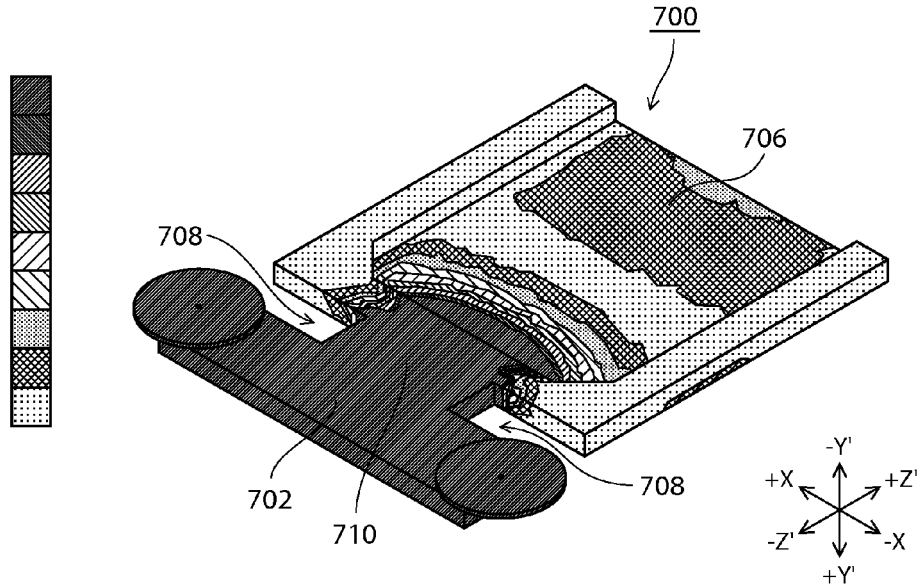
Figure 23B:
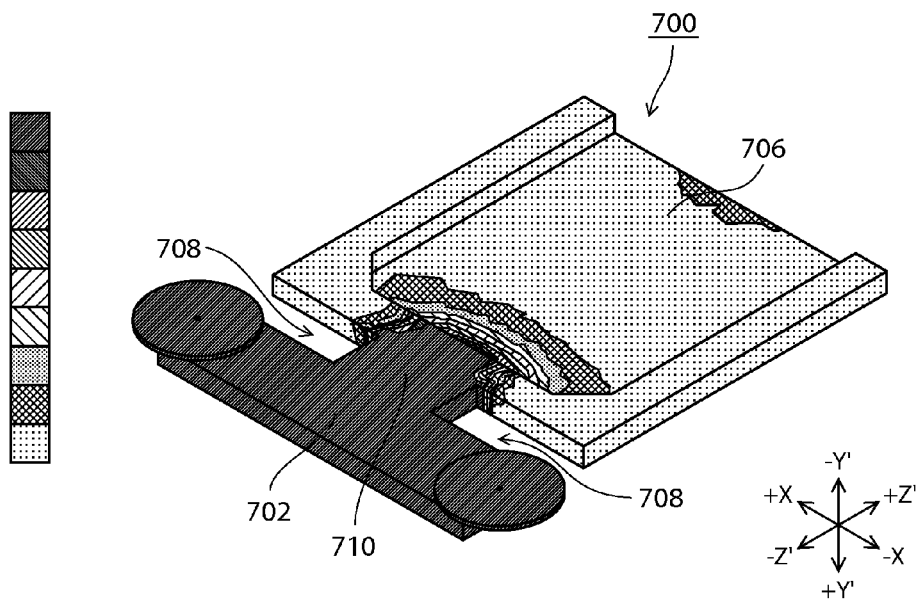
Figure 24A:
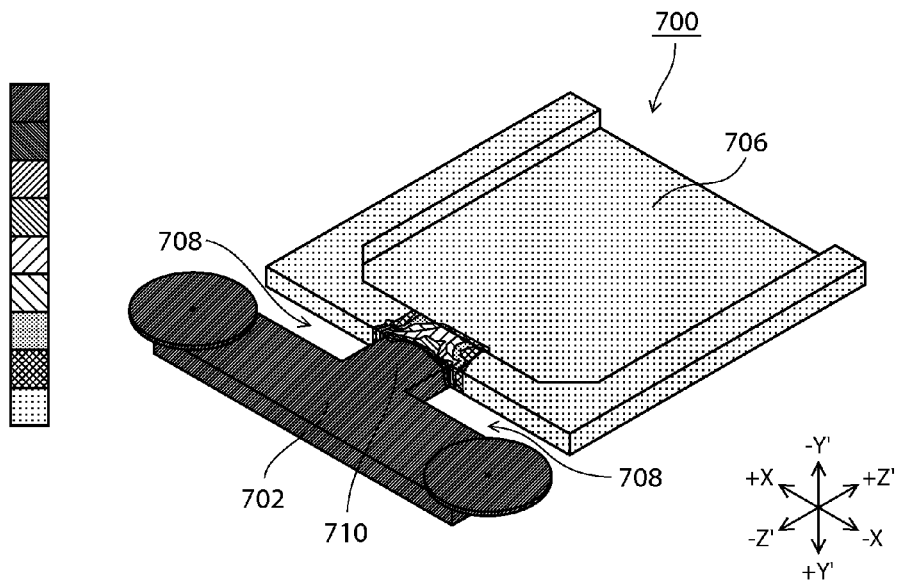
Figure 24B:
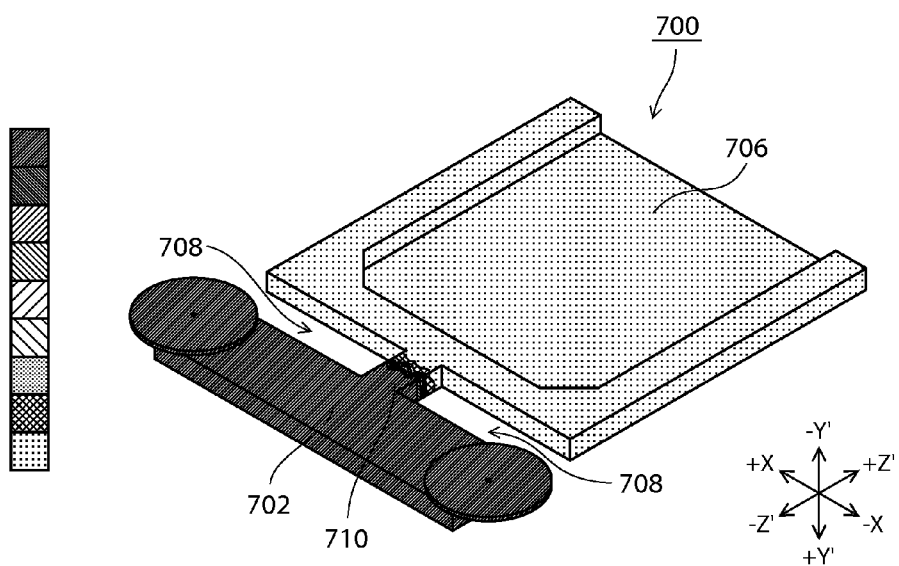

FIGS. 20A and 20B show the third modified example of the piezoelectric module according to the present embodiment, in which FIG. 20A is a schematic view of a piezoelectric module in which the cross-section of a container has a so-called H-shaped structure, and FIG. 20B is a schematic view of a single side-sealed piezoelectric module. In third modified example, a piezoelectric module 500 uses the piezoelectric vibrator element 70 of the third embodiment (or the other embodiments), and a thermosensor (thermistor 512) for detecting temperature is mounted on the piezoelectric module 500 so that the piezoelectric module 500 has the function of a temperature sensor. In FIG. 20A, the mounting surface of the mount portion 12 of the piezoelectric vibrator element 70 faces a mounting substrate 502, and the mount portion 12 and the connection electrodes 504 disposed on the mounting substrate 502 are bonded by the conductive adhesive agent 32, whereby the piezoelectric module 500 having the piezoelectric vibrator element 70 mounted thereon is realized. Moreover, a cover (a side wall portion 506 and a lid 508) covering the piezoelectric vibrator element 70 is disposed on the mounting substrate 502. Furthermore, a recess portion 510 is disposed on a surface of the mounting substrate 502 opposite the piezoelectric vibrator element 70. Furthermore, the thermistor 512 capable of measuring the temperature of the mounting substrate 502 is disposed in the recess portion 510.

With the above configuration, the temperature around the piezoelectric vibrator element 70, namely the terminal-ejection position of an inner space which seals the piezoelectric vibrator element 70 by being closed by the mounting substrate 502 and the cover (the side wall portion 506 and the lid 508) can be measured by measuring the temperature of the bottom portion of the recess portion 510 of the mounting substrate 502. Thus, it is possible to obtain the piezoelectric module 500 capable of performing highly accurate temperature compensation on an oscillation signal oscillated from the piezoelectric vibrator element 70.

Furthermore, with the above configuration, it is possible to test the electrical properties or the operation state of the piezoelectric vibrator element 70 before mounting the thermosensor (the thermistor 512) after the piezoelectric vibrator element 70 is mounted on the mounting substrate 502. Thus, it is possible to classify the piezoelectric vibrator elements 70 into non-defective products and defective products based on the test results of the piezoelectric vibrator elements 70. Therefore, the thermosensor can be mounted on only the mounting substrate 502 on which a non-defective piezoelectric vibrator element excluding defective products is mounted. Accordingly, it is possible to prevent unnecessary wasting of thermosensors to suppress an increase in the cost and realize cost reduction.

A piezoelectric module 501 shown in FIG. 20B has a similar configuration to the piezoelectric module 500 shown in FIG. 20A. However, unlike the piezoelectric module 500, a recess portion 514 is disposed on a surface of the mounting substrate 502 facing the piezoelectric vibrator element 70. Moreover, a thermosensor (the thermistor 512) capable of measuring the temperature of an inner space which seals the piezoelectric vibrator element 70 by being closed by the mounting substrate 502 and the cover (the side wall portion 506 and the lid 508) is disposed in the recess portion 514. In FIGS. 20A and 20B, although the thermistor 512 is mounted, the integrated circuit (the IC 404) may be mounted, and it is preferable to incorporate a thermosensor such as a thermistor into the integrated circuit.

The entire disclosure of Japanese Patent Application No. 2010-266715, filed Nov. 30, 2010 and Japanese Patent Application No. 2011-178998, filed Aug. 18, 2011 are expressly incorporated by reference herein.

What is claimed is:

1. A piezoelectric vibrator element comprising:
a vibrating member that is in a rectangular shape with first through fourth sides, a peripheral portion that is continuously formed at the first through third sides in a peripheral area of the vibrating member, a vibrating portion that is formed at a center area of the vibrating member and that is surrounded by the peripheral portion;
a neck portion, a buffering portion and a mount portion that are sequentially connected to the peripheral portion located at the second side of the vibrating portion in a first direction;
a slit that is formed in the buffering portion between the mount portion and the neck portion;
first notches that are formed at both ends of the mount portion in a second direction perpendicular to the first direction; and
second notches that are formed at both ends of the neck portion in the second direction, wherein
a first width of the peripheral portion located at the second side in the second direction is narrower than a second width of the buffering portion in the second direction, and a third width of the neck portion defined by the second notches in the second direction is the same as the first width of the peripheral portion located at the second side.

2. The piezoelectric vibrator element according to claim 1, wherein a thickness of the peripheral portion is thicker than a thickness of the vibrating portion, and wherein thicknesses of the buffering portion and the mount portion are the same as the peripheral portion.

3. The piezoelectric vibrator element according to claim 1, wherein the piezoelectric vibrator element is formed of an AT-cut quartz crystal in which in an orthogonal coordinate system made up of the crystal axes of a quartz crystal, which are an X axis serving as an electrical axis, a Y axis serving as a mechanical axis, and a Z axis serving as an optical axis, an axis which is the Z axis tilted in a negative (−)Y direction of the Y axis about the X axis is a Z' axis, and an axis which is the Y axis tilted in a positive (+) Z direction of the Z axis about the X axis is a Y' axis, the AT-cut quartz crystal being configured by a plane parallel to the X axis and the Z' axis, and in which a thickness direction thereof is a direction parallel to the Y' axis.

4. The piezoelectric vibrator element according to claim 1, wherein excitation electrodes for vibrating the vibrating portion are formed on first and second surfaces of the vibrating portion, wherein a pair of extraction electrodes electrically connected to the respective excitation electrodes is formed on a mounting surface of the mount portion, and wherein an opposite surface opposite to the mounting surface of the mount portion and the first surface of the vibrating portion are flat.

5. The piezoelectric vibrator element according to claim 4, wherein a thickness of a center area, on which the excitation electrode are forms, of the vibrating portion is thicker than a thickness of a circumference area between the center area and the peripheral portion.

6. A piezoelectric vibrator on which the piezoelectric vibrator element according to claim 1 is mounted in a state where the mounting surface of the mount portion of the piezoelectric vibrator element faces a substrate, and the mount portion and the substrate are bonded to each other by a conductive adhesive agent.

7. A piezoelectric vibrator on which the piezoelectric vibrator element according to claim 2 is mounted in a state where the mounting surface of the mount portion of the piezoelectric vibrator element faces a substrate, and the mount portion and the substrate are bonded to each other by a conductive adhesive agent.

8. A piezoelectric vibrator on which the piezoelectric vibrator element according to claim 3 is mounted in a state where the mounting surface of the mount portion of the piezoelectric vibrator element faces a substrate, and the mount portion and the substrate are bonded to each other by a conductive adhesive agent.

9. An electronic device on which the piezoelectric vibrator element according to claim 1 is mounted in a state where the mounting surface of the mount portion of the piezoelectric vibrator element faces a substrate, and the mount portion and the substrate are bonded to each other by a conductive adhesive agent.

10. An electronic device on which the piezoelectric vibrator element according to claim 2 is mounted in a state where the mounting surface of the mount portion of the piezoelectric vibrator element faces a substrate, and the mount portion and the substrate are bonded to each other by a conductive adhesive agent.

11. An electronic device on which the piezoelectric vibrator element according to claim 3 is mounted in a state where the mounting surface of the mount portion of the piezoelectric vibrator element faces a substrate, and the mount portion and the substrate are bonded to each other by a conductive adhesive agent.

12. The piezoelectric vibrator element according to claim 1, wherein a thickness of the peripheral portion is thinner than a thickness of the vibrating portion.

13. The piezoelectric vibrator element according to claim 4, wherein a thickness of the vibrating portion is thicker than a thickness of the peripheral portion.

* * * * *